United States Patent
Ikeda et al.

(10) Patent No.: US 11,865,590 B2
(45) Date of Patent: Jan. 9, 2024

(54) SUBSTRATE CLEANING METHOD, PROCESSING CONTAINER CLEANING METHOD, AND SUBSTRATE PROCESSING DEVICE

(71) Applicant: Tokyo Electron Limited, Tokyo (JP)

(72) Inventors: Kyoko Ikeda, Yamanashi (JP); Kazuya Dobashi, Hillsboro, OR (US); Tsunenaga Nakashima, Kumamoto (JP); Kenji Sekiguchi, Yamanashi (JP); Shuuichi Nishikido, Kumamoto (JP); Masato Nakajo, Kumamoto (JP); Takahiro Yasutake, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/048,102

(22) Filed: Oct. 20, 2022

(65) Prior Publication Data
US 2023/0063907 A1 Mar. 2, 2023

Related U.S. Application Data

(62) Division of application No. 17/295,971, filed as application No. PCT/JP2019/045418 on Nov. 20, 2019, now Pat. No. 11,504,751.

(30) Foreign Application Priority Data

Nov. 30, 2018 (JP) .................. 2018-225669

(51) Int. Cl.
B08B 5/02 (2006.01)
H01L 21/02 (2006.01)

(52) U.S. Cl.
CPC .......... *B08B 5/02* (2013.01); *H01L 21/02041* (2013.01)

(58) Field of Classification Search
None
See application file for complete search history.

(56) References Cited

U.S. PATENT DOCUMENTS

| | | | |
|---|---|---|---|
| 2005/0082000 A1 | 4/2005 | Moriya et al. | |
| 2009/0068598 A1* | 3/2009 | Murase | B23K 26/0732 430/311 |

FOREIGN PATENT DOCUMENTS

| | | |
|---|---|---|
| CN | 108369905 | 8/2018 |
| JP | H11-297653 | 10/1999 |
| JP | 2003-001208 | 1/2003 |
| JP | 2005-101539 | 4/2005 |
| JP | 2015-026745 | 2/2015 |
| JP | 2018-060857 | 4/2018 |

OTHER PUBLICATIONS

Google Patents translation of JP2003001208A retrieved from https://patents.google.com/patent/JP2003001208A/en?pq=jp2003001208 on Mar. 22, 2022 (Year: 2022), In parent U.S. Appl. No. 17/295,971.

* cited by examiner

*Primary Examiner* — Eric W Golightly
(74) *Attorney, Agent, or Firm* — IPUSA, PLLC

(57) ABSTRACT

A substrate cleaning method includes: arranging a substrate within a processing container; spraying gas from a spray port of a gas nozzle arranged within the processing container; causing vertical shock waves, generated by spraying the gas from the gas nozzle, to collide with a main surface of the substrate; and removing particles adhering to the main surface of the substrate, by causing the vertical shock waves to collide with the main surface of the substrate.

4 Claims, 18 Drawing Sheets

FIG.16
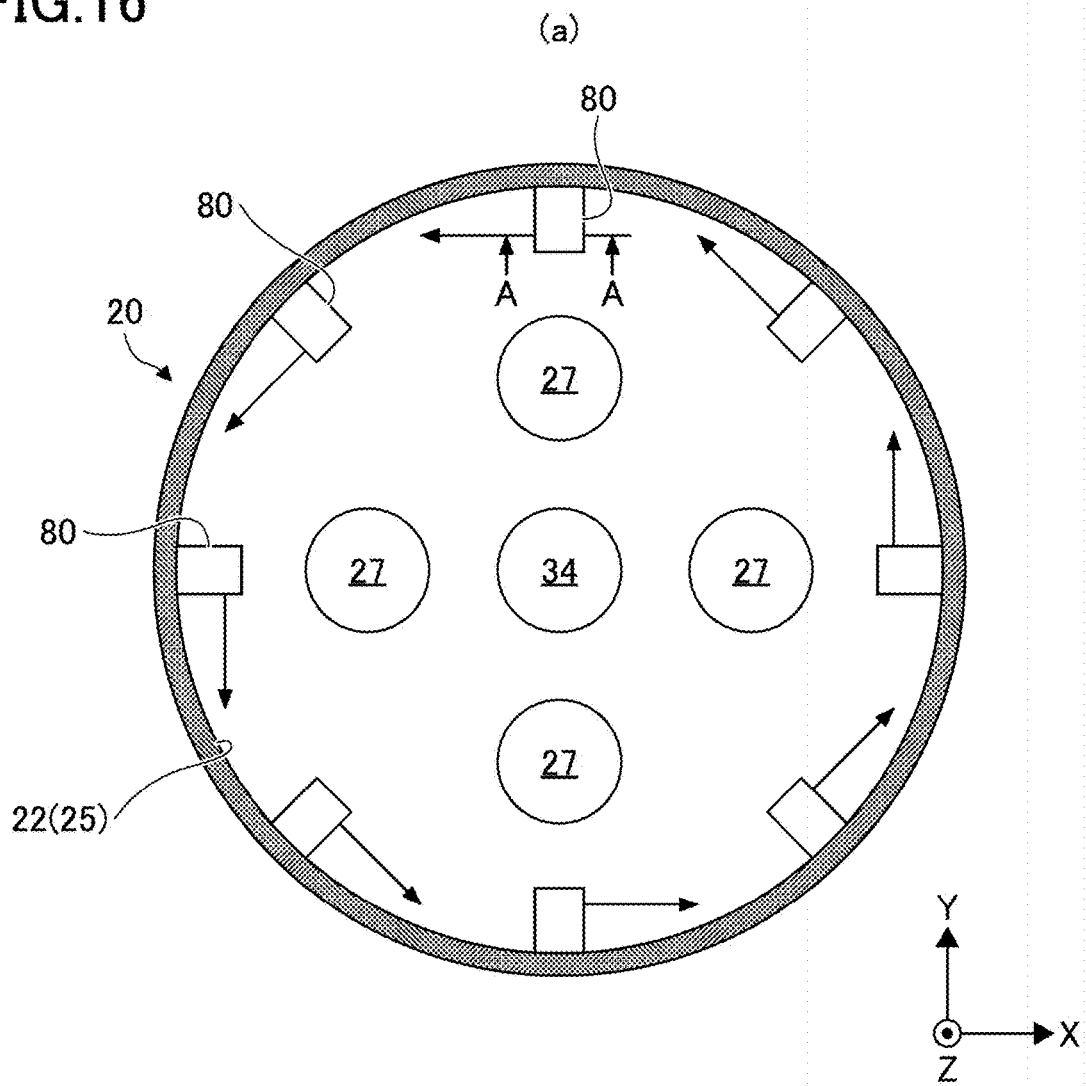
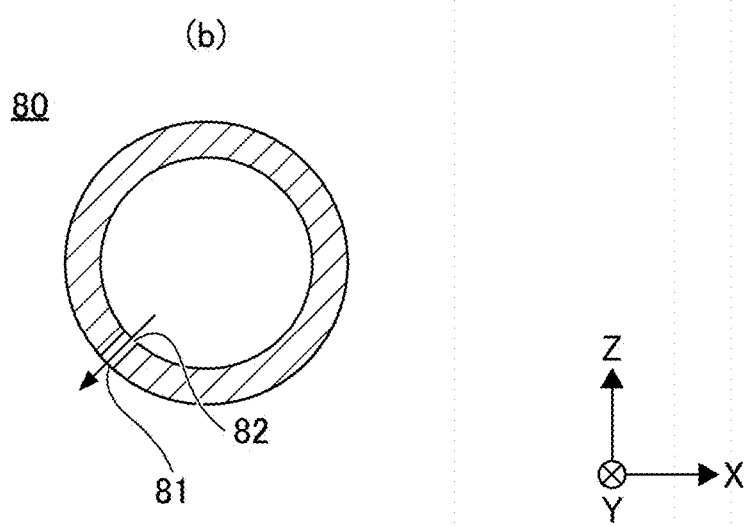

FIG.17
(a)
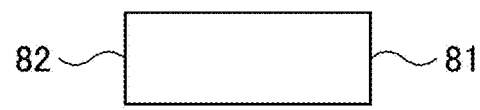
(b)
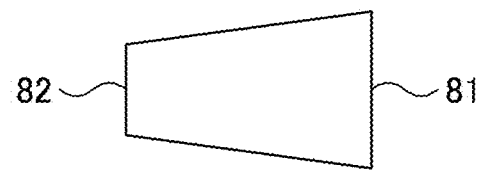

SUBSTRATE CLEANING METHOD, PROCESSING CONTAINER CLEANING METHOD, AND SUBSTRATE PROCESSING DEVICE

CROSS-REFERENCES TO RELATED APPLICATIONS

This application is a divisional application of and claims the benefit of priority under 35 U.S.C. 120 to patent application Ser. No. 17/295,971 filed on May 21, 2021, and issued as U.S. Pat. No. 11,504,751 on Nov. 22, 2022, which claims priority to Japanese Patent Application No. 2018-225669 filed on Nov. 30, 2018. The contents of these applications are incorporated herein by reference in their entirety.

TECHNICAL FIELD

The present disclosure relates to a substrate cleaning method, a processing container cleaning method, and a substrate processing device.

BACKGROUND ART

A substrate cleaning method disclosed in Patent Document 1 includes a step of generating a gas cluster by discharging gas from a nozzle and a step of removing particles by emitting the gas cluster perpendicular to the surface of a substrate. The distance from the tip of the nozzle to the substrate at the time of emitting the gas cluster is 10 mm to 100 mm.

PRIOR ART DOCUMENT

Patent Document

[Patent Document 1] Japanese Laid-open Patent Publication No. 2015-26745

SUMMARY OF THE INVENTION

Problem to be Solved by the Invention

One aspect of the present disclosure provides a technique that enables to efficiently remove particles that contaminate a substrate.

Means for Solving Problem

According to one aspect of the present disclosure, a substrate cleaning method includes: arranging a substrate within a processing container; spraying gas from a spray port of a gas nozzle arranged within the processing container; causing vertical shock waves, generated by spraying the gas from the gas nozzle, to collide with a main surface of the substrate; and removing particles adhering to the main surface of the substrate, by causing the vertical shock waves to collide with the main surface of the substrate.

Effect of the Invention

According to one aspect of the present disclosure, it is possible to efficiently remove particles that contaminate a substrate.

BRIEF DESCRIPTION OF THE DRAWINGS

FIG. 16 is a diagram illustrating a gas nozzle formed on a side wall surface that is an inner wall surface of the processing container according to an embodiment;

FIG. 17 is a diagram illustrating an example of a cross-sectional shape of a nozzle hole of a gas nozzle that forms a vortex airflow.

EMBODIMENT FOR CARRYING OUT THE INVENTION

Figure 1:
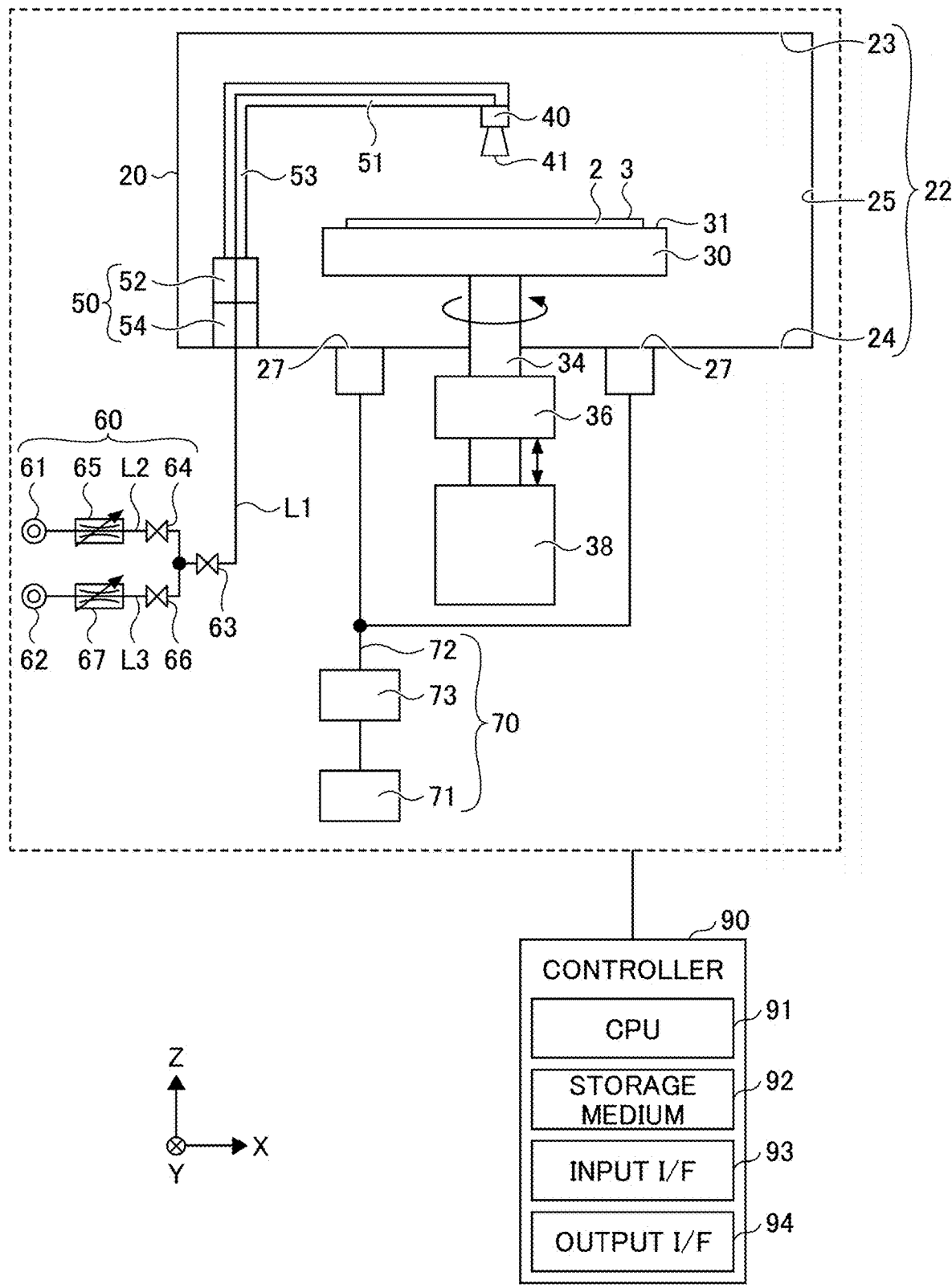
FIG. 1 is a side view illustrating a substrate processing device according to an embodiment.

In the following, embodiments of the present disclosure will be described with reference to the drawings. In each drawing, the same or corresponding elements may be indicated by the same or corresponding reference numerals and their descriptions may be omitted. In the following description, the X-axis direction, the Y-axis direction, and the Z-axis direction are perpendicular to each other, the X-axis direction and the Y-axis direction are horizontal directions, and the Z-axis direction is a vertical direction. Also, downward means downward in the vertically direction (negative Z-axis direction), and upward means upward in the vertical direction (positive Z-axis direction).

Figure 2:
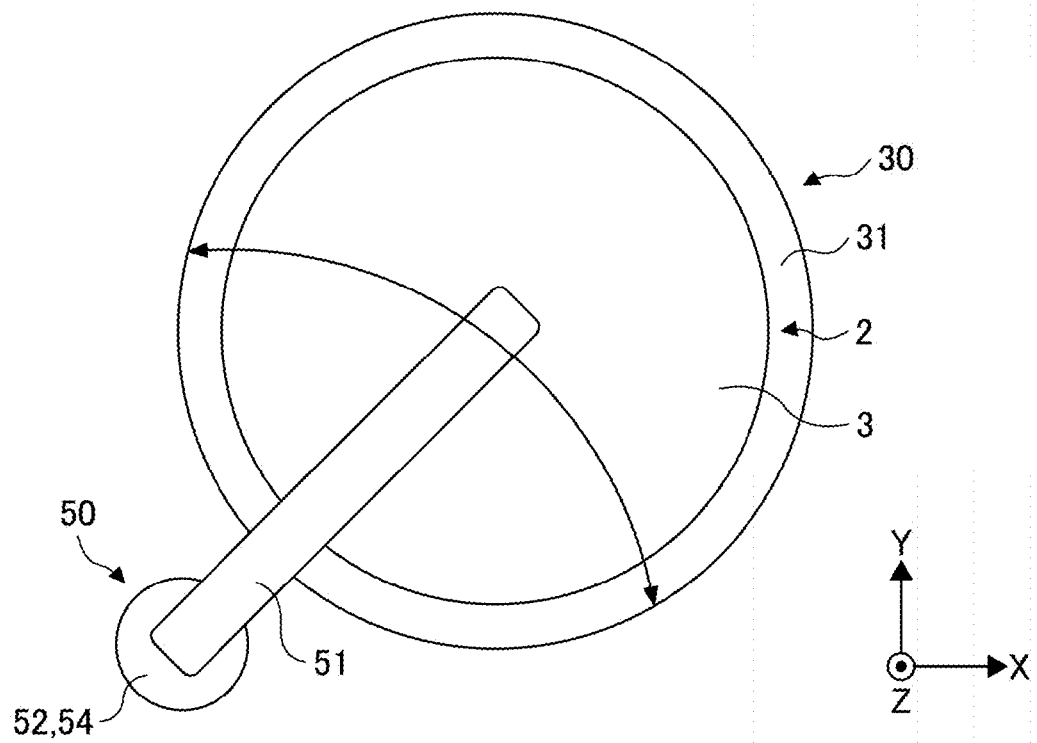
FIG. 2 is a plan view illustrating a gas nozzle movement mechanism according to an embodiment.

FIG. 1 is a side view illustrating a substrate processing device according to an embodiment. FIG. 2 is a plan view illustrating a gas nozzle movement mechanism according to an embodiment. A substrate processing device 10 removes particles 5 and 6 (see FIG. 12) adhering to a main surface 3 of a substrate 2 by spraying gas toward the main surface 3 of the substrate 2. The substrate 2 is a semiconductor substrate such as a silicon wafer. The substrate processing device 10 includes a processing container 20, a substrate holder 30, a rotation shaft 34, a rotation driver 36, a lifting/lowering driver 38, a gas nozzle 40, a gas nozzle movement mechanism 50, a gas supply mechanism 60, a depressurization mechanism 70, and a controller 90.

The processing container 20 has an inside space in which the substrate 2 is processed. The inside of the processing container 20 is, for example, a cylindrical space. The processing container 20 has a gate (not illustrated) that is an inlet/outlet of the substrate 2 and a gate valve (not illustrated) that opens/closes the gate.

The substrate holder 30 is arranged within the processing container 20 and has a substrate holding surface 31 for holding the substrate 2. For example, the substrate holder 30 holds the substrate 2 horizontally such that the main surface 3 of the substrate 2 is oriented upward where the particles 5 and 6 are removed.

The rotation shaft 34 extends downward from the center of the substrate holder 30 and is vertically arranged. The upper end of the rotation shaft 34 is arranged within the processing container 20, and the lower end of the rotation shaft 34 is arranged outside the processing container 20.

The rotation driver 36 rotates the substrate holder 30 by rotating the rotation shaft 34 around a vertical axis. The rotation driver 36 includes, for example, a rotation motor and a transmission mechanism that transmits the rotation drive force of the rotation motor to the rotation shaft 34.

The lifting/lowering driver 38 lifts/lowers the substrate holder 30. The lifting/lowering driver 38 is composed of, for example, a fluid pressure cylinder or the like. Although the lifting/lowering driver 38 lifts/lowers the substrate holder 30 through the rotation driver 36, the substrate holder 30 may be lifted/lowered without the rotation driver 36.

The gas nozzle 40 sprays gas toward the main surface 3 of the substrate 2 held by the substrate holder 30. The gas nozzle 40 is arranged above the substrate holder 30 with the gas a spray port 41 downward.

The gas nozzle movement mechanism 50 moves the gas nozzle 40 in the radial direction of the substrate holder 30. The gas nozzle movement mechanism 50 moves the gas nozzle 40 between a position directly above the center of the substrate holder 30 and a position directly above the outer periphery of the substrate holder 30.

The gas nozzle movement mechanism 50 includes, for example, a pivot arm 51 and a pivot driver 52 that pivots the pivot arm 51. The pivot arm 51 is arranged horizontally and holds the gas nozzle 40 at its tip such that the spray port 41 of the gas nozzle 40 is oriented downward. The pivot driver 52 pivots the pivot arm 51 around a pivot shaft 53 extending downward from a base end of the pivot arm 51.

It should be noted that the gas nozzle movement mechanism 50 may include a guide rail and a linear motion mechanism instead of the pivot arm 51 and the pivot driver 52. The guide rail is arranged horizontally and the liner motion mechanism moves the gas nozzle 40 along the guide rail.

The gas nozzle movement mechanism 50 may further include a lifting/lowering driver 54 that lifts/lowers the gas nozzle 40. The lifting/lowering driver 54 is composed of, for example, a fluid pressure cylinder or the like. Although the lifting/lowering driver 54 lifts/lowers the gas nozzle 40 through the pivot driver 52, the gas nozzle 40 may be lifted/lowered without the pivot driver 52.

The gas supply mechanism 60 supplies gas to the gas nozzle 40. The gas supply mechanism 60 has a common line L1 with the downstream end connected to the gas nozzle 40, a first branch line L2 extending from the upstream end of the common line L1 to a first supply source 61, and a second branch line L3 extending from the upstream end of the common line L1 to a second supply source 62.

The common line L1 is provided with a pressure adjustment valve 63 that adjusts the supply pressure P of the gas to the gas nozzle 40. The pressure adjustment valve 63 adjusts the supply pressure P of the gas to the gas nozzle 40 under the control of the controller 90. It should be noted that a booster, such as a gas booster, may be further provided on the upstream side of the pressure adjustment valve 63 of the common line L1.

The first branch line L2 is provided with a first open/close valve 64 and a first flow rate adjustment valve 65. When the first open/close valve 64 opens the flow path of the gas, the gas is supplied from the first supply source 61 to the gas nozzle 40. The first flow rate adjustment valve 65 adjusts the flow rate of the gas flowing through the first branch line L2. When the first open/close valve 64 closes the flow path of the gas, the supply of the gas from the first supply source 61 to the gas nozzle 40 is stopped.

The second branch line L3 is provided with a second open/close valve 66 and a second flow rate adjustment valve 67. When the second open/close valve 66 opens the flow path of the gas, the gas is supplied from the second supply source 62 to the gas nozzle 40. The second flow rate adjustment valve 67 adjusts the flow rate of the gas flowing through the second branch line L3. When the second open/close valve 66 closes the flow path of the gas, the gas supply from the second supply source 62 to the gas nozzle 40 is stopped.

The first supply source 61 supplies, for example, carbon dioxide ($CO_2$) gas to the gas nozzle 40. On the other hand, the second supply source 62 supplies, for example, hydrogen ($H_2$) gas to the gas nozzle 40. The content rate C of carbon dioxide gas contained in the gas supplied to the gas nozzle 40 is adjusted by the first flow rate adjustment valve 65 and the second flow rate adjustment valve 67. The first flow rate adjustment valve 65 and the second flow rate adjustment valve 67 adjust the content rate C of carbon dioxide gas under the control of the controller 90. It should be noted that in a case in which the controller 90 sets the content rate C of carbon dioxide gas to be zero, the second open/close valve 66 closes the flow path of the gas under the control of the controller 90.

The depressurization mechanism 70 depressurizes the inside of the processing container 20. The depressurization mechanism 70 includes, for example, a suction pump 71 that sucks gas from the inside of the processing container 20 and a pressure adjustment valve 73 that is provided in the middle of a suction line 72 extending from suction ports 27 famed on an inner wall surface 22 of the processing container 20 to the suction pump 71. The suction ports 27 may be formed on a lower wall surface 24 of the processing container 20 and may be arranged with an equal interval around the rotation shaft 34.

The controller 90 is comprised of, for example, a computer and includes a CPU (Central Processing Unit) 91 and a storage medium 92, such as a memory. The storage medium 92 stores a program for controlling various processes that are executed in the substrate processing device 10. The controller 90 controls the operation of the substrate processing device 10 by causing the CPU 91 to execute the program stored in the storage medium 92. The controller 90 also includes an input interface 93 and an output interface 94. The controller 90 receives a signal from the outside at the input interface 93 and transmits a signal to the outside at the output interface 94.

Such a program may be stored in a computer-readable storage medium and may be installed from the storage medium into the storage medium 92 of the controller 90. Examples of the computer-readable storage medium include a hard disk (HD), a flexible disk (FD), a compact disk (CD), a magneto optical desk (MO), a memory card, and the like. It should be noted that the program may be downloaded from a server via the Internet and may be installed in the storage medium 92 of the controller 90.

Figure 3:
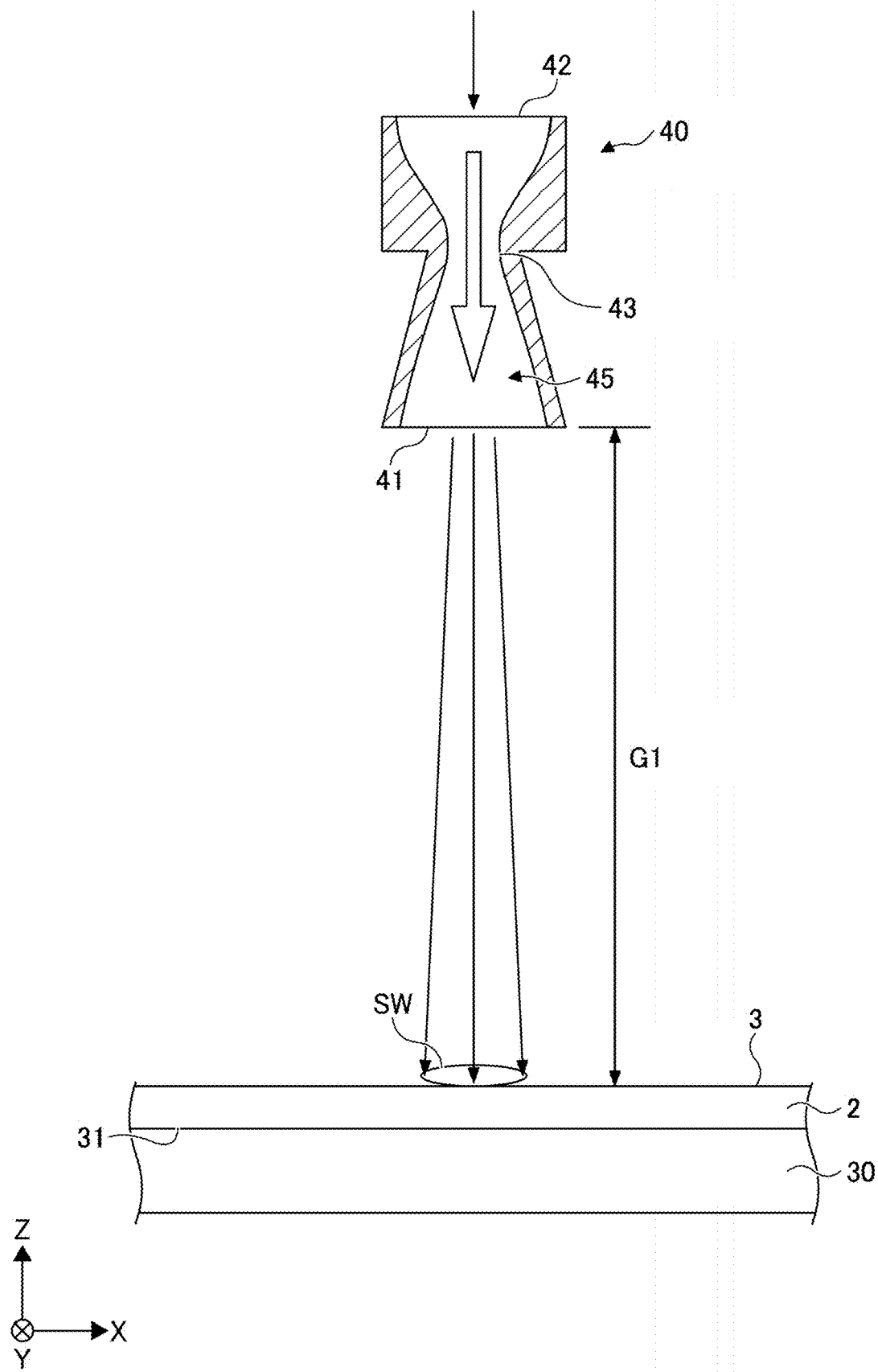
FIG. 3 is a cross-sectional view illustrating collision of vertical shock waves with a substrate according to an embodiment.

FIG. 3 is a cross-sectional view illustrating collision of vertical shock waves with the substrate according to an embodiment. The gas nozzle 40 is, for example, commonly referred to as a Laval nozzle and has a throat 43 having a diameter smaller than that of the spray port 41 and the supply port 42. The gas nozzle 40 has a tapered hole 45 between the throat 43 and the spray port 41 such that the diameter increases from the throat 43 toward the spray port 41.

The gas nozzle 40 is arranged within the processing container 20. The inside of the processing container 20 is depressurized in advance by the depressurization mechanism 70. The gas supplied to the supply port 42 of the gas nozzle 40 is accelerated to a speed exceeding the speed of sound by passing through the throat 43 and is sprayed from the spray port 41.

The sprayed gas forms vertical shock waves SW. A vertical shock wave SW is also referred to as a Mach disk. The vertical shock waves SW are shock waves having a wavefront perpendicular to the propagation direction. A shock wave is a discontinuous change in pressure propagating within the processing container 20 at supersonic speed.

The controller 90 controls the collision of the gas with the substrate 2 held by the substrate holder 30. For example, the collision of the gas with the substrate 2 varies depending on a gap G1 between the spray port 41 of the gas nozzle 40 and the main surface 3 of the substrate 2; (2) the content rate C of carbon dioxide gas contained in the gas supplied to the gas nozzle 40; and (3) the supply pressure P of the gas to the gas nozzle 40.

Therefore, the controller 90 controls at least one of the gap G1, the content rate C of carbon dioxide gas, and the supply pressure P to control the collision of the gas with the substrate 2. Here, the controller 90 may control the gap G1 by controlling the Z-axis position of the substrate holder 30 or may control the gap G1 by controlling the Z-axis position of the gas nozzle 40.

The controller 90 causes the vertical shock waves SW generated by spraying the gas to collide with the main surface 3 of the substrate 2. Because the vertical shock waves SW act on the main surface 3 of the substrate 2, as will be described later in detail, it is possible to efficiently remove large-sized particles 5 having particle diameters of 100 nm or more adhering to the main surface 3 of the substrate 2.

The centerline of the gas nozzle 40 may be arranged perpendicular to the main surface 3 of the substrate 2. The wavefront of the vertical shock waves SW collides in parallel with the main surface 3 of the substrate 2. Therefore, the range over which the vertical shock waves SW act on the main surface 3 of the substrate 2 is wide, and the large-sized particles 5 can be efficiently removed. Further, it is possible to suppress a pattern collapse of a protruding/recessed pattern 4 on the main surface 3 of the substrate 2.

Figure 4:
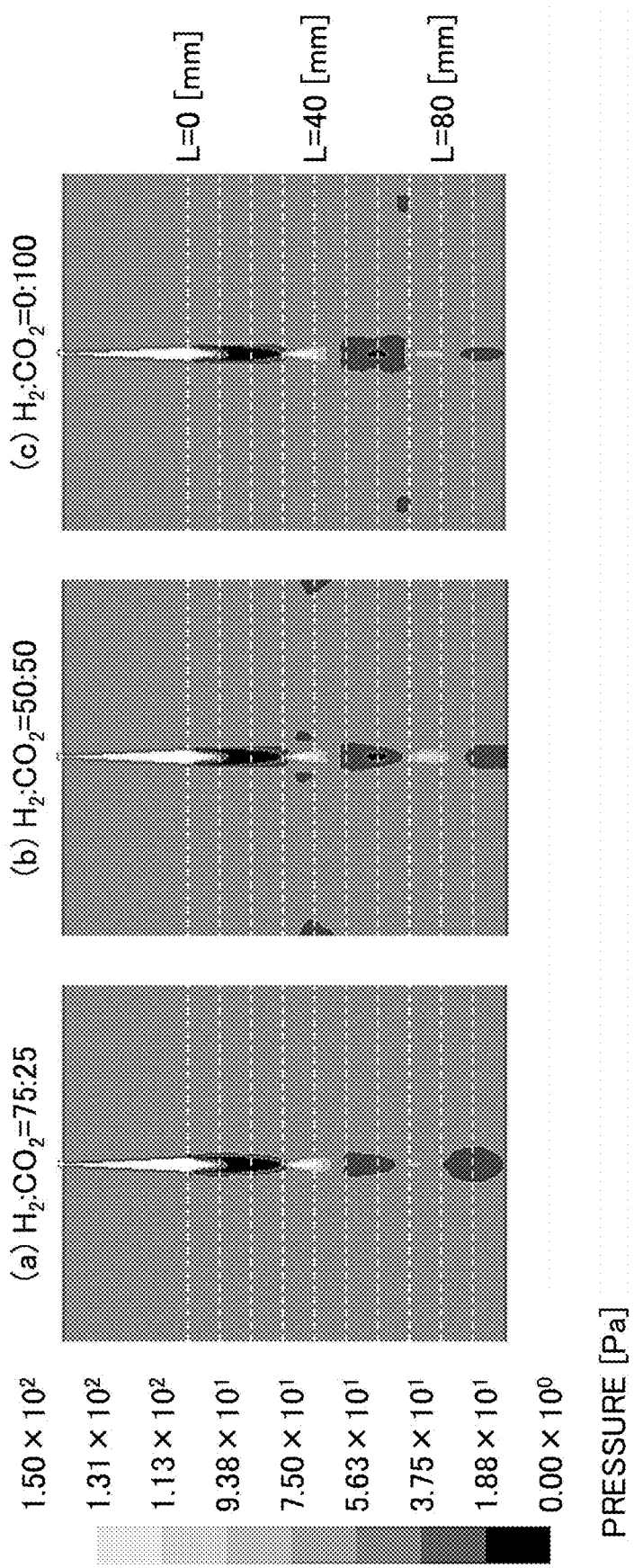
FIG. 4 is a diagram illustrating an example of a relationship between a distance L from a spray port of a gas nozzle and a pressure of gas sprayed from the spray port.

FIG. 4 is a diagram illustrating an example of a relationship between a distance L from the spray port of the gas nozzle and a pressure of the gas sprayed from the spray port. FIG. 4(a) illustrates an example of a simulation result of pressure when the content rate C of carbon dioxide gas is 25% by volume and the content rate of hydrogen gas is 75% by volume. FIG. 4(b) illustrates an example of a simulation result of pressure when the content rate C of carbon dioxide gas is 50% by volume and the content rate of hydrogen gas is 50% by volume. FIG. 4(c) illustrates an example of a simulation result of pressure when the content rate C of carbon dioxide gas is 100% by volume and the content rate of hydrogen gas is 0% by volume.

In the simulations of FIG. 4, fluid analysis of steady state was performed using fluid analysis software (trade name: Fluent) of ANSYS, Inc. Also, in the simulations of FIG. 4, the diameter of the supply port 42 was set to 10 mm, the diameter of the throat 43 was set to 0.24 mm, the diameter of the spray port 41 was set to 4.4 mm, and the tapered angle of the tapered hole 45 was set to 6°. Further, in the simulations of FIG. 4, the supply pressure P of the gas at the supply port 42 was set to 0.7 MPa, the temperature of the gas at the supply port 42 was set to −10° C., and the pressure inside the processing container 20 was set to 40 Pa. Further, in the simulations of FIG. 4, a rectangular two-dimensional analysis area symmetrical about the centerline of the gas nozzle 40 was set, and an outflow boundary where gas freely flows out was set at the four sides of the two-dimensional analysis area.

As can be seen from FIG. 4, it is found that in an area GA (see FIG. 6) where the distance L in the downward direction from the spray port 41 of the gas nozzle 40 is about 30 mm to 40 mm and in an area GB (see FIG. 6) where the distance L is about 70 mm to 80 mm, vertical shock waves SW, which are a discontinuous change in pressure, are formed.

Figure 5:
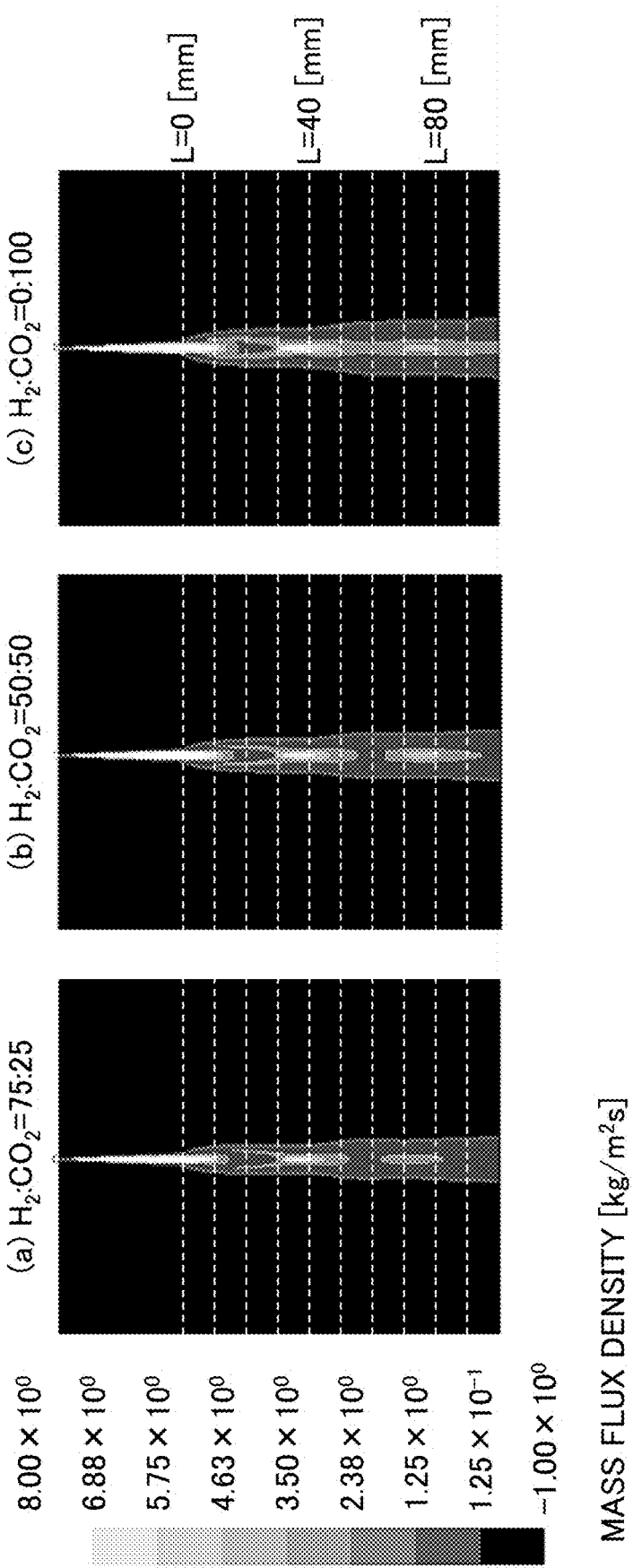
FIG. 5 is a diagram illustrating an example of a relationship between the distance L from the spray port of the gas nozzle and a mass flux density D of the gas sprayed from the spray port.

FIG. 5 is a diagram illustrating an example of a relationship between the distance L in the downward direction from the spray port of the gas nozzle and the mass flux density D of the gas sprayed from the spray port. FIG. 5(a) illustrates an example of a simulation result of the mass flux density when the content rate C of carbon dioxide gas is 25% by volume and the content rate of hydrogen gas is 75% by volume. FIG. 5(b) illustrates an example of a simulation result of the mass flux density when the content rate C of carbon dioxide gas is 50% by volume and the content rate of hydrogen gas is 50% by volume. FIG. 5(c) illustrates an example of a simulation result of the mass flux density when the content rate C of carbon dioxide gas is 100% by volume and the content rate of hydrogen gas is 0% by volume. It should be noted that the simulations in FIG. 5 were performed with the same settings as the simulations in FIG. 4.

The mass flux density D is a physical quantity that indicates the mass of gas passing through a unit area in a unit time and is an index of the strength of the vertical shock waves SW. The mass flux density D is calculated by the following formula (1).

$$D = \rho \times v \quad (1)$$

In the above formula (1), $\rho$ is the gas density (kg/m$^3$) and v is the gas flow velocity (m/s). A positive gas flow velocity means that the gas flows from top to bottom, and a negative gas flow velocity means that the gas flows from bottom to top. As the supply pressure P increases, both the gas density $\rho$ and the gas flow velocity v increase, and therefore the mass flux density D increases. Also, as the content rate C of carbon dioxide gas, having a higher molecular weight than hydrogen gas, increases, the gas density $\rho$ increases, and therefore the mass flux density D increases.

As can be seen from the simulation results in FIG. 5 and the simulation results in FIG. 4, it is found that vertical shock waves SW are formed where the mass flux density D is large.

Figure 6:
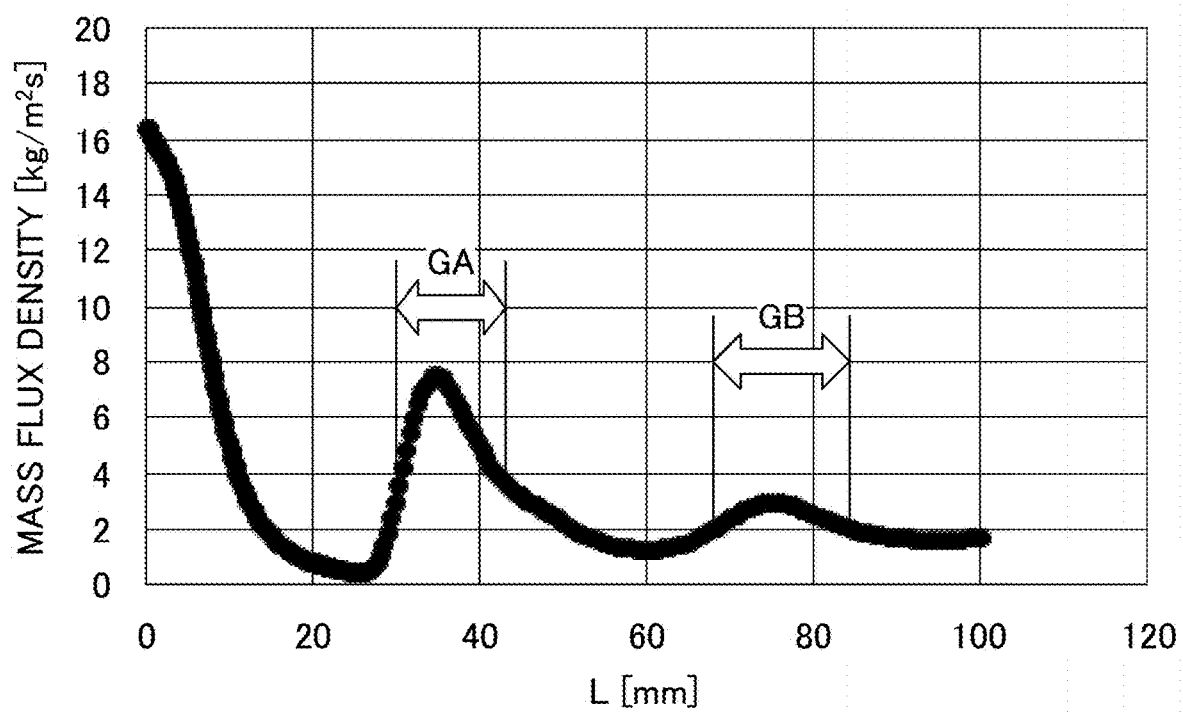
FIG. 6 is a graph illustrating an example of a simulation result illustrated in FIG. 5C.

FIG. 6 is a graph illustrating an example of the simulation result illustrated in FIG. 5(c). As illustrated in FIG. 6, as the distance L increases from zero, the mass flux density D decreases rapidly, thereafter the mass flux density D increases rapidly, and thereafter the mass flux density D repeatedly decreases and increases.

As can be seen from the comparison of the simulation result in FIG. 6 with the simulation results in FIG. 4, it is found that the vertical shock waves SW are famed by at the areas GA and GB where the mass flux density D is more than half the value of each peak value.

It should be noted that vertical shock waves SW do not occur at the area where the distance L is about 0 mm to 25 mm and the mass flux density D rapidly decreases.

Figure 7:
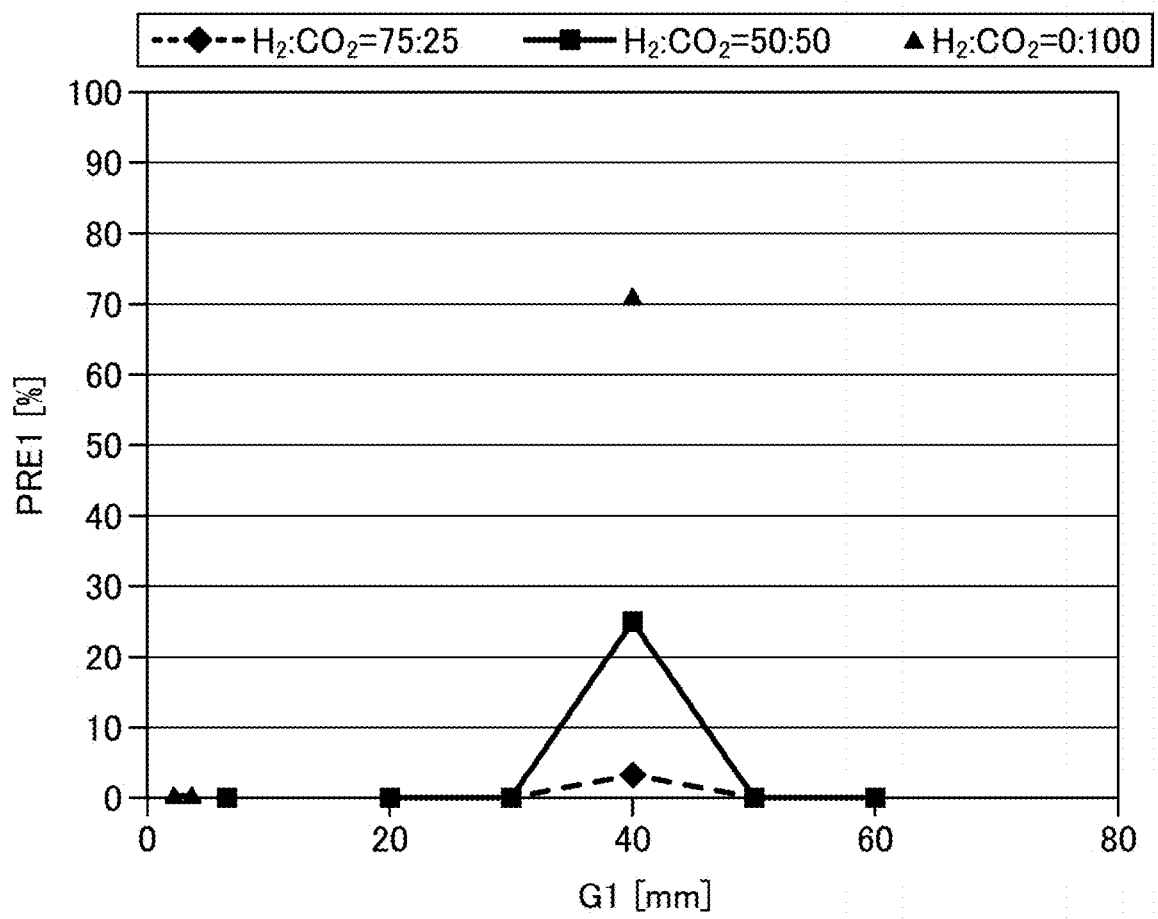
FIG. 7 is a diagram illustrating an example of a relationship between a removal rate PRE1 of particles having a particle diameter of 200 nm and the gap G1 between the spray port of the gas nozzle and the main surface of the substrate.

FIG. 7 is a diagram illustrating an example of a relationship between a removal rate PRE1 of particles having a particle diameter of 200 nm and the gap G1 between the spray port of the gas nozzle and the main surface of the substrate. The removal rate PRE1 of particles was calculated from the following formula (2).

$$PRE1 = (n1 - n2)/n1 \times 100 \quad (2)$$

In the above formula (2), n1 is the number of silica particles with a particle diameter of 200 nm adhering to the main surface 3 of the substrate 2 before cleaning, and n2 is the number of silica particles with a particle diameter of 200 nm remaining on the main surface 3 of the substrate 2 after cleaning. The numbers n1 and n2 of silica particles were measured by SEM (Scanning Electron Microscope).

The substrate 2 was cleaned by setting the rotation speed of the substrate holder 30 to be 150 rpm, setting the pivot speed of the gas nozzle 40 to be 1°/s, and causing the gas from the gas nozzle 40 to collide with the entire main surface 3 of the substrate 2 held by the substrate holder 30. Further, in the cleaning of the substrate 2, as in the simulations of FIG. 4, the diameter of the supply port 42 was set to 10 mm, the diameter of the throat 43 was set to 0.24 mm, the diameter of the spray port 41 was set to 4.4 mm, and the tapered angle of the tapered hole 45 was set to 6°. Further, in the cleaning of the substrate 2, as in the simulations of FIG. 4, the supply pressure P of the gas at the supply port 42 was set to 0.7 MPa, the temperature of the gas at the supply port 42 was set to −10° C., and the pressure inside the processing container 20 was set to 40 Pa.

As can be seen from FIG. 7, it is found that the removal rate PRE of silica particles with a particle diameter of 200 nm is enhanced when the gap G1 is about 40 mm. It should be noted that when the gap G1 is about 40 mm, the vertical shock waves SW collide with the main surface 3 of the substrate 2, as can be seen from FIG. 8, which will be described later. Therefore, it is found that, by causing the vertical shock waves SW to collide with the main surface 3 of the substrate 2, the removal rate PRE1 of silica particles with a particle diameter of 200 nm is enhanced.

Also, as can been seen from FIG. 7, as the content rate C of carbon dioxide gas, having a higher molecular weight than hydrogen gas, increases, the removal rate PRE1 of silica particles having a particle diameter of 200 nm is enhanced. As can be seen from the above formula (1), the mass flux density D is proportional to the gas density p. Therefore, the reason is presumed to be that as the content rate C of carbon dioxide gas increases, the mass flux density D increases.

Figure 8:
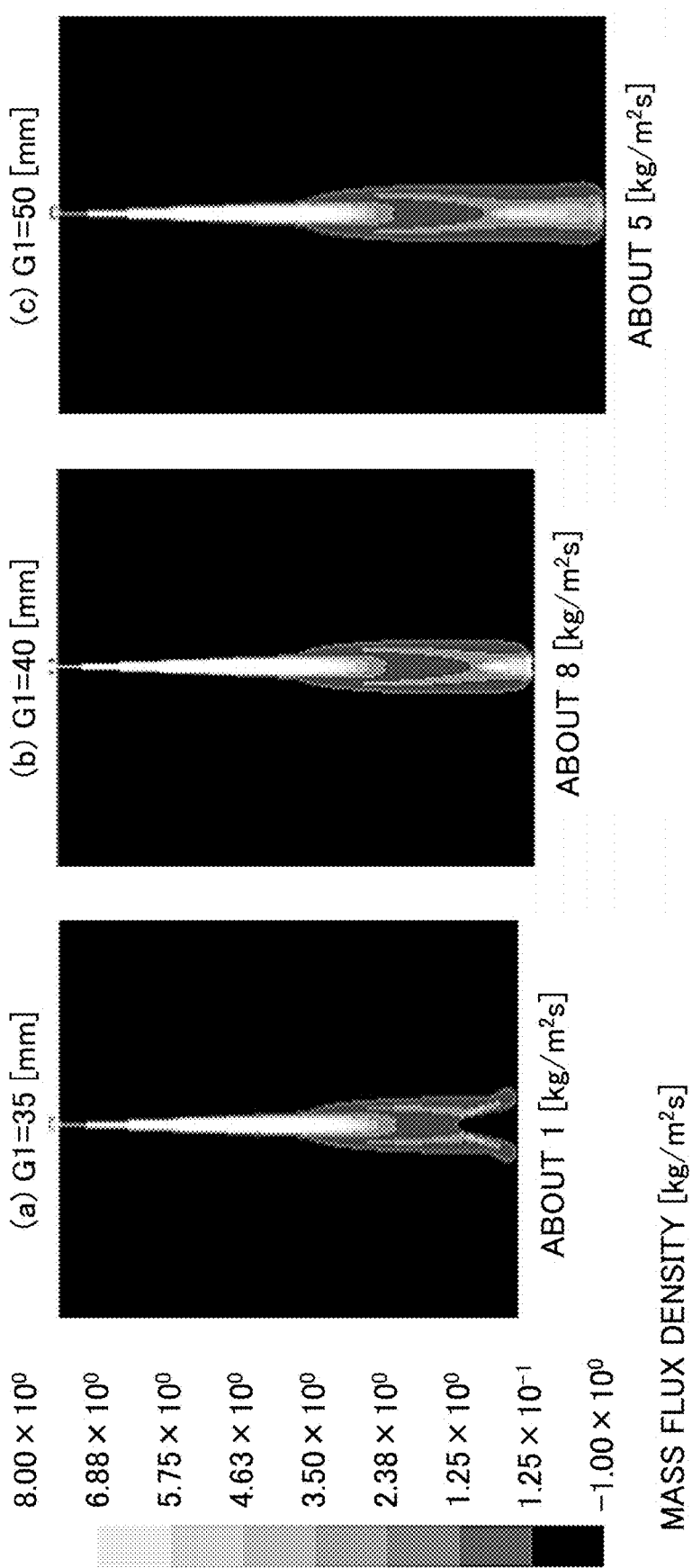
FIG. 8 is a diagram illustrating an example of a relationship between the gap G1 between the spray port of the gas nozzle and the main surface of the substrate and the mass flux density of the gas sprayed from the spray port.

FIG. 8 is a diagram illustrating an example of a relationship between the gap G1 between the spray port of the gas nozzle and the main surface of the substrate and the mass flux density of the gas sprayed from the spray port. FIG. 8(a) illustrates an example of a simulation result of the mass flux density when the gap G1 is 35 mm. FIG. 8(b) illustrates an example of a simulation result of the mass flux density when the gap G1 is 40 mm. FIG. 8(c) illustrates an example of a simulation result of the mass flux density when the gap G1 is 50 mm.

In the simulations of FIG. 8, at a position 35 mm, 40 mm, or 50 mm away from the spray port 41 of the gas nozzle 40 downward, as the main surface 3 of the substrate 2, a wall boundary with no gas inflow and outflow was set at the lower one side of a rectangular two-dimensional analysis area. An outflow boundary where gas freely flows out was set for the other three sides of the rectangular two-dimensional analysis area. Also, in the simulations of FIG. 8, the content rate C of carbon dioxide was set to 100% by volume and the content rate of hydrogen gas was set to 0% by volume. The other settings were the same as the settings of the simulations of FIG. 4.

As can be seen from FIG. 8, it is found that, when the gap G1 is 40 mm, it is possible to cause the vertical shock waves SW having a mass flux density D of about 8 kg/m$^2$s to collide with the main surface 3 of the substrate 2. It should be noted that the position where the vertical shock waves SW are generated slightly deviates between the simulation result of FIG. 8 and the simulation result of FIG. 5(c) and FIG. 6 due to the boundary condition settings. The simulation result in FIG. 8 in which the wall boundary was set on the lower one side of the two-dimensional analysis area corresponds to Example, and the simulation result in FIG. 5(c) and FIG. 6 in which the outflow boundary was set on the lower one side of the two-dimensional analysis area corresponds to Reference Example.

Figure 9:
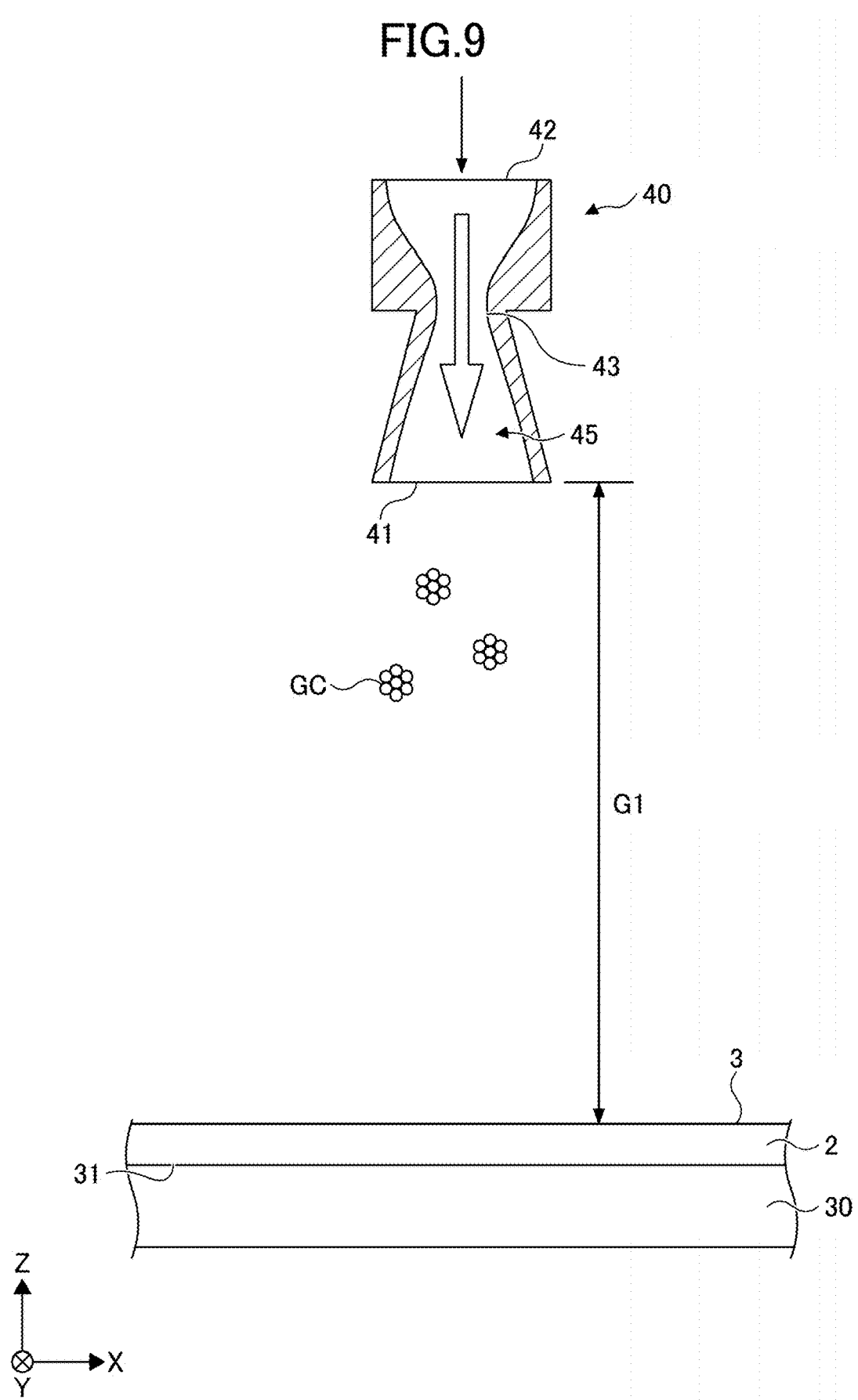
FIG. 9 is a cross-sectional view illustrating collision of gas clusters with the substrate according to an embodiment.

FIG. 9 is a cross-sectional view illustrating collision of gas clusters with the substrate according to an embodiment. The collision of the gas clusters GC with the substrate 2 illustrated in FIG. 9 and the collision of the vertical shock waves SW with the substrate 2 illustrated in FIG. 3 differ in at least one of the gap G1, the content rate C of carbon dioxide gas, and the supply pressure P. First, the generation of the gas clusters GC will be described.

The gas nozzle 40 is arranged within the processing container 20. The inside of the processing container 20 is depressurized in advance by the depressurization mechanism 70. The gas supplied to the supply port 42 of the gas nozzle 40 passes through the throat 43 at a speed of sound. After passing through the throat 43, the gas is accelerated by adiabatic expansion to a speed exceeding the speed of sound and is sprayed from the spray port 41.

The sprayed gas is adiabatically expanded within the decompressed processing container 20 and thus is rapidly cooled to a condensation temperature to form gas clusters GC that are an aggregate of atoms or molecules. For example, a gas cluster GC is an aggregate of molecules of carbon dioxide gas coupled together by van der Waals force.

By passing through the throat 43 in a mixed state with carbon dioxide, hydrogen gas can increase the spraying speed of carbon dioxide gas. As a result, it is possible to accelerate the gas clusters GC famed by carbon dioxide gas.

The controller 90 causes the gas clusters GC, generated by spraying the gas, to collide with the main surface 3 of the substrate 2. Because the gas clusters GC act on the main surface 3 of the substrate 2, as will be described below in detail, it is possible to efficiently remove the small-sized particles 6 with particle diameters of several tens of nanometers adhering to the main surface 3 of the substrate 2.

Figure 10:
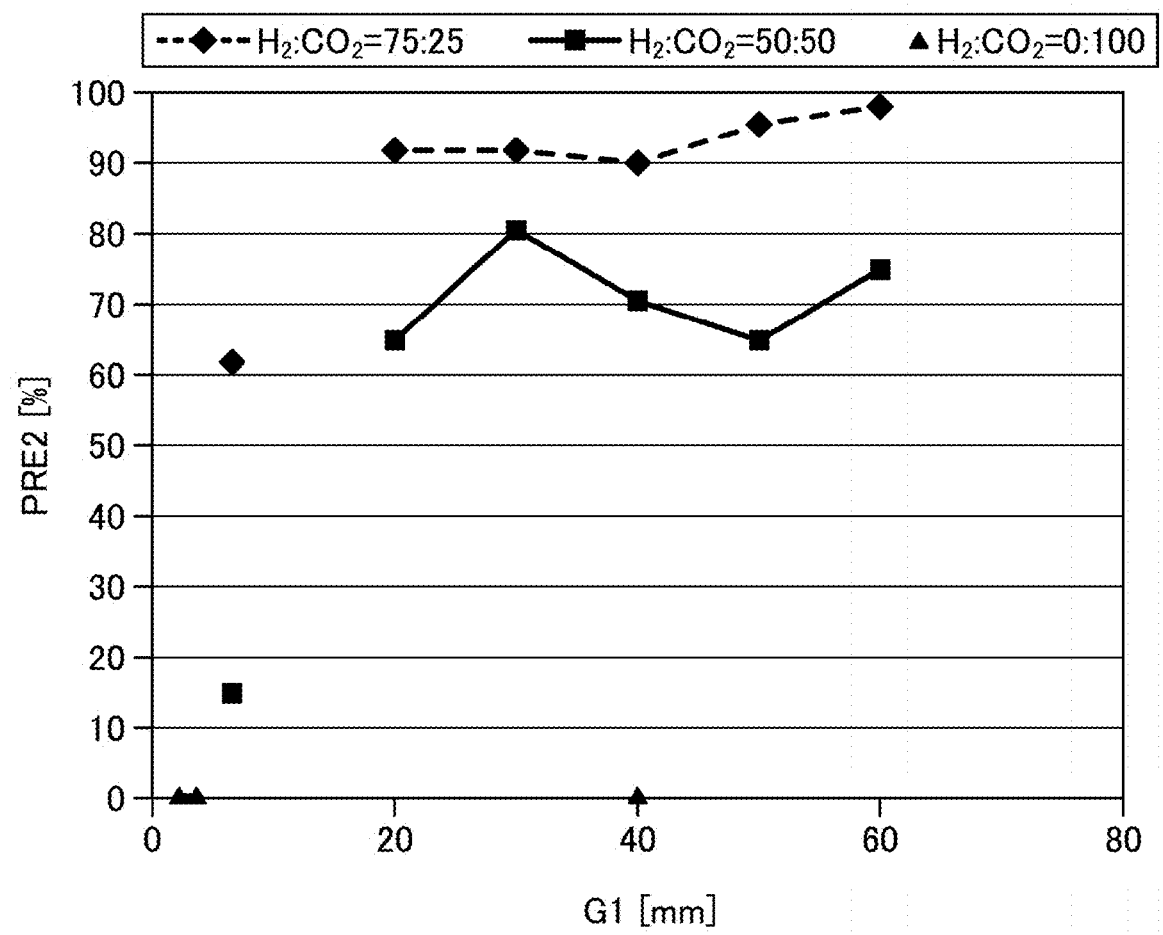
FIG. 10 is a diagram illustrating an example of a relationship between a removal rate PRE2 of particles having a particle diameter of 40 nm and the gap G1 between the spray port of the gas nozzle and the main surface of the substrate.

FIG. 10 is a diagram illustrating an example of a relationship between a removal rate PRE2 of particles having a particle diameter of 40 nm and the gap G1 between the spray port of the gas nozzle and the main surface of the substrate. The removal rate PRE2 of particles was calculated from the following formula (3).

$$PRE2=(n3-n4)/n3\times 100 \quad (3)$$

In the above formula (3), n3 is the number of silica particles with a particle diameter of 40 nm adhering to the main surface 3 of the substrate 2 before cleaning, and n4 is the number of silica particles with a particle diameter of 40 nm remaining on the main surface 3 of the substrate 2 after cleaning. The numbers n3 and n4 of silica particles were measured by SEM (Scanning Electron Microscope).

The substrate 2 was cleaned by setting the rotation speed of the substrate holder 30 to be 150 rpm, setting the pivot speed of the gas nozzle 40 to be 1°/s, and causing the gas from the gas nozzle 40 to collide with the entire main surface 3 of the substrate 2 held by the substrate holder 30. Further, in the cleaning of the substrate 2, as in the simulations of FIG. 4, the diameter of the supply port 42 was set to 10 mm, the diameter of the throat 43 was set to 0.24 mm, the diameter of the spray port 41 was set to 4.4 mm, and the tapered angle of the tapered hole 45 was set to 6°. Further, in the cleaning of the substrate 2, as in the simulations of FIG. 4, the supply pressure P of the gas at the supply port 42 was set to 0.7 MPa, the temperature of the gas at the supply port 42 was set to −10° C., and the pressure inside the processing container 20 was set to 40 Pa.

As can be seen from FIG. 10, it is found that there is a better condition of the removal rate PRE2 than a condition in which vertical shock waves SW having a mass flux density D of about 8 kg/m²s collide with the main surface 3 of the substrate 2 (G1=40 mm, C=100% by volume). Because of having small surface areas, the small-sized particles 6 are less likely to receive the pressure of the vertical shock waves SW and are less likely to receive the benefits thereof. High speed collisions of the gas clusters GC, which are aggregates of molecules, are effective in removing the small-sized particles 6. Also, as described in the above paragraph 0054, mixing with hydrogen gas can increase the speed of the gas clusters GC.

Also, as can be seen from FIG. 10, when the content rate C of carbon dioxide gas is 100% by volume, the removal rate PRE2 of the silica particles having a particle diameter of 40 nm was substantially zero regardless of the gap G1. The cause was presumed to be a shortage of hydrogen gas that suppresses the stall of the gas clusters GC.

Figure 11:
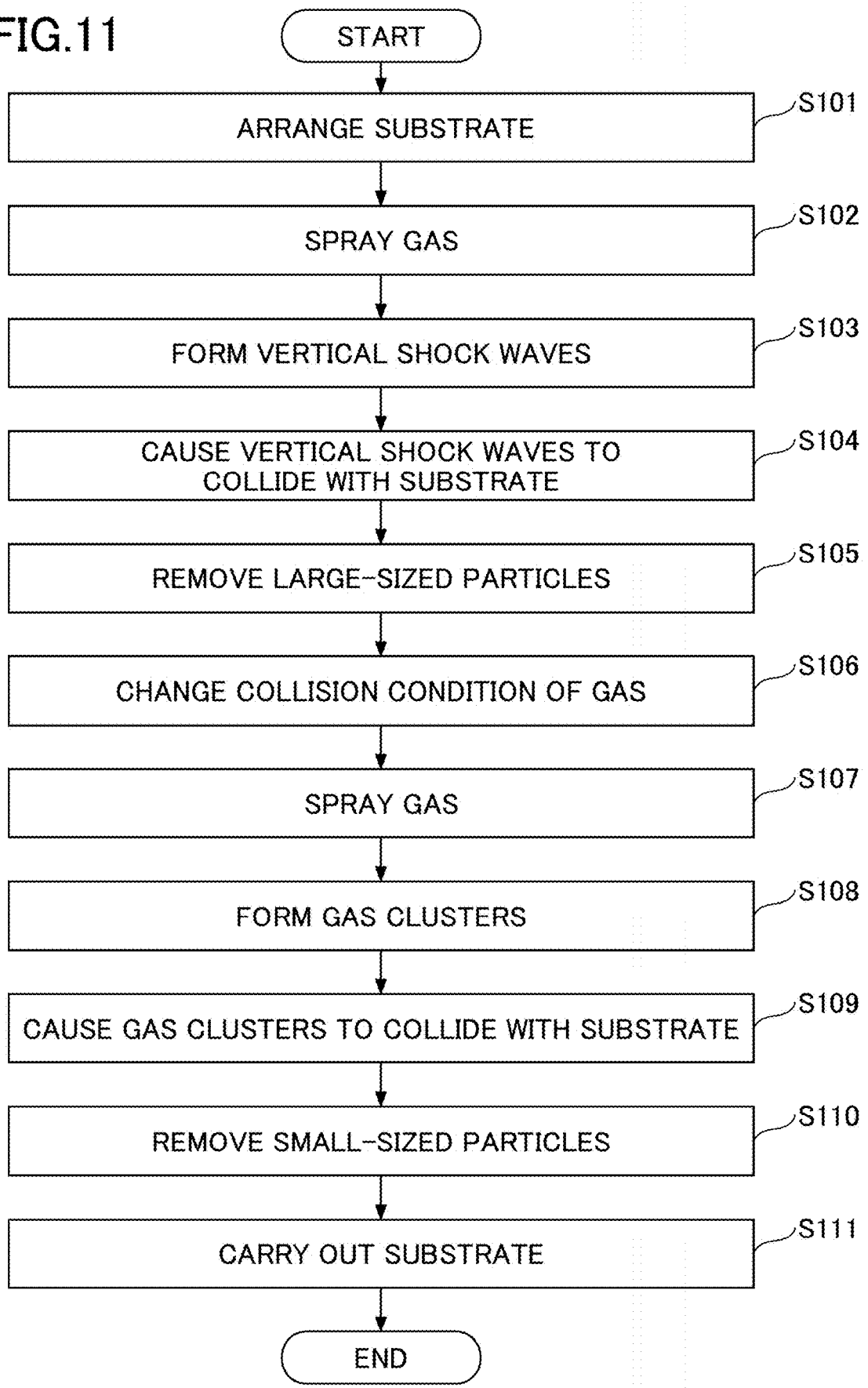
FIG. 11 is a flowchart illustrating a substrate cleaning method according to an embodiment.

FIG. 11 is a flowchart illustrating a substrate cleaning method according to an embodiment. Each step illustrated in FIG. 11 is performed under the control of the controller 90.

The substrate cleaning method includes step S101 of arranging the substrate 2 within the processing container 20. In step S101, a transfer device imports the substrate 2 from the outside of the processing container 20 into the inside of the processing container 20 and arranges the imported substrate 2 on the substrate holding surface 31 of the substrate holder 30. The substrate holder 30 holds the substrate 2 horizontally with the main surface 3 of the substrate 2 upward.

The substrate processing method includes step S102 of spraying gas from the spray port 41 of the gas nozzle 40 arranged within the processing container 20. In step S102, the pressurization mechanism 70 sucks gas inside the processing container 20 and the gas supply mechanism 60 supplies gas to the gas nozzle 40.

The composition of the gas supplied to the gas nozzle 40 (e.g., the content rate C of carbon dioxide gas) is adjusted by the first flow rate adjustment valve 65 and the second flow rate adjustment valve 67, for example. When the content rate C of carbon dioxide gas is 100% by volume, the second open/close valve 66 closes the flow path of the gas. Also, the supply pressure P of the gas supplied to the gas nozzle 40 is adjusted by the pressure adjustment valve 63.

The substrate processing method includes step S103 of forming vertical shock waves SW by spraying the gas. As illustrated in FIG. 6, the areas GA and GB where the vertical shock waves SW are formed are discontinuous, and there are areas where vertical shock waves SW are not formed.

The substrate processing method includes step S104 of causing the vertical shock waves SW to collide with the main surface 3 of the substrate 2. The wavefront of the vertical shock waves SW may collide in parallel with the main surface 3 of the substrate 2. The range over which the vertical shock waves SW act on the main surface 3 of the substrate 2 is wide. Further, it is possible to suppress a pattern collapse of the protruding/recessed pattern 4 on the main surface 3 of the substrate 2.

When causing the vertical shock waves SW to collide with the main surface 3 of the substrate 2, the gap G1 between the spray port 41 of the gas nozzle 40 and the main surface 3 of the substrate 2 may be controlled to be, for example, 37 mm or more and 45 mm or less. It is possible to cause the strong vertical shock waves SW to collide with the main surface 3 of the substrate 2.

Also, when causing the vertical shock waves SW to collide with the main surface 3 of the substrate 2, the mass flux density D of the gas near the main surface 3 of the substrate 2 may be controlled to be, for example, 6 kg/m²s or more. It is possible to cause the strong vertical shock waves SW to collide with the main surface 3 of the substrate 2. It should be noted that D may be controlled to be 15 kg/m²s or less. Near the main surface 3 of the substrate 2 means a range of 2 mm or less from the main surface 3.

The substrate processing method includes step S105 of removing large-sized particles 5 having particle diameters of 100 nm or more. In step S105, the vertical shock waves SW separate the large-sized particles 5 from the main surface 3 of the substrate 2 by their pressure.

Step S102 through step S105 described above are repeatedly performed while changing the position where the vertical shock waves SW hit the substrate 2. The change is accomplished, for example, by the rotation driver 36 rotating the substrate holder 30 and the gas nozzle movement mechanism 50 moving the gas nozzle 40 in the radial direction of the substrate 2. It is possible to cause the vertical shock waves SW to hit the entire main surface 3 of the substrate 2.

It should be noted that although the position where the vertical shock waves SW hit the substrate 2 is changed by rotating the substrate holder 30 and by moving the gas nozzle 40 in the radial direction of the substrate 2 in the present embodiment, the technique of the present disclosure is not limited to this. For example, in a state in which the gas nozzle 40 fixed, the substrate holder 30 may be moved in the X axis direction and the Y axis direction.

The substrate processing method includes step S106 of changing the collision condition of the gas with the substrate 2. In step S106, the controller 90 changes at least one of the gap G1, the content rate C of carbon dioxide gas, and the supply pressure P to change the collision condition of the gas with the substrate 2. Each of the collision condition before being changed (e.g., the collision condition for removing large-sized particles 5) and the collision conditions after being changed (e.g., the collision condition for removing small-sized particles 6) is determined in advance by experiment or simulation and stored in the storage medium 92.

The substrate processing method includes step S107 of spraying gas from the spray port 41 of the gas nozzle 40 arranged within the processing container 20. In step S107, the depressurization mechanism 70 sucks gas within the processing container 20 and the gas supply mechanism 60 supplies gas to the gas nozzle 40.

The composition of the gas supplied to the gas nozzle 40 (e.g., the content rate C of carbon dioxide gas) is adjusted by the first flow rate adjustment valve 65 and the second flow rate adjustment valve 67, for example. The content rate C of carbon dioxide gas is preferably 90% by volume or less to reduce the stall of the gas clusters GC. Also, the supply pressure P of the gas supplied to the gas nozzle 40 is adjusted by the pressure adjustment valve 63.

The substrate processing method includes step S108 of forming gas clusters GC by spraying gas. For example, the gas clusters GC are aggregates of molecules of carbon dioxide gas coupled together by van der Waals force.

The substrate processing method includes step S109 of causing the gas clusters GC to collide with the main surface 3 of the substrate 2. The gas clusters GC may collide perpendicularly with the main surface 3 of the substrate 2. It is possible to suppress a pattern collapse of the protruding/recessed pattern 4 on the main surface 3 of the substrate 2.

The substrate processing method includes step S110 of removing small-sized particles 6 having particle diameters of several tens of nanometers. As described above, high speed collisions of the gas clusters GC, which are aggregates of molecules, are effective in removing the small-sized particles 6.

Step S107 to step S110 described above are repeatedly performed while changing the position where the gas clusters GC hit the substrate 2. The change is accomplished, for example, by the rotation driver 36 rotating the substrate holder 30 and the gas nozzle movement mechanism 50 moving the gas nozzle 40 in the radial direction of the substrate 2. It is possible to cause the gas clusters GC SW to hit the entire main surface 3 of the substrate 2.

It should be noted that although the position where the gas clusters GC hit the substrate 2 is changed by rotating the substrate holder 30 and by moving the gas nozzle 40 in the radial direction of the substrate 2 in the present embodiment, the technique of the present disclosure is not limited to this. For example, in a state in which the gas nozzle 40 fixed, the substrate holder 30 may be moved in the X axis direction and the Y axis direction.

The substrate processing method includes step S111 of carrying out the substrate 2 from the inside of the processing container 20 to the outside of the processing container 20. In step S111, the substrate holder 30 releases the holding of the substrate 2, and the transfer device receives the substrate 2 from the substrate holder 30 and carries out the received substrate 2 from the inside of the processing container 20 to the outside of the processing container 20.

It should be noted that the order of the respective steps illustrated in FIG. 11 is not particularly limited. For example, in a case in which the substrate processing device 10 has a plurality of gas nozzles 40, in parallel with performing steps S102 to S105 using one gas nozzle 40, the substrate processing device 10 may perform steps S107 to S110 using another one gas nozzle 40.

Further, part of the steps illustrated in FIG. 11 may be omitted. In a case in which the substrate processing device 10 has a plurality of gas nozzles 40, because conditions of colliding gas with the main surface 3 of substrate 2 can be set for each gas nozzle 40, step S106 is not required.

As described above, the substrate processing method according to the present embodiment includes step S105 of removing the large-sized particles 5 adhering to the main surface 3 of the substrate 2 by causing the vertical shock waves SW to collide with the main surface 3 of the substrate 2. In composition to a case of causing gas clusters GC to collide with the main surface 3 of the substrate 2, the removal efficiency of the large-sized particles 5 can be enhanced, and the cleaning time of the substrate 2 can be reduced.

It is also possible to remove the small-sized particles 6 by causing vertical shock waves SW to collide with the main surface 3 of the substrate 2, but its removal efficiency may be lower than that of when causing gas clusters GC to collide with the main surface 3 of the substrate 2.

Therefore, the substrate processing method according to the present embodiment includes step S110 of removing the small-sized particles 6 adhering to the main surface 3 of the substrate 2 by causing the gas clusters GC to collide with the main surface 3 of the substrate 2. Therefore, the removal efficiency of the small-sized particles 6 can be enhanced, and the cleaning time of the substrate 2 can be shortened.

Figure 12:
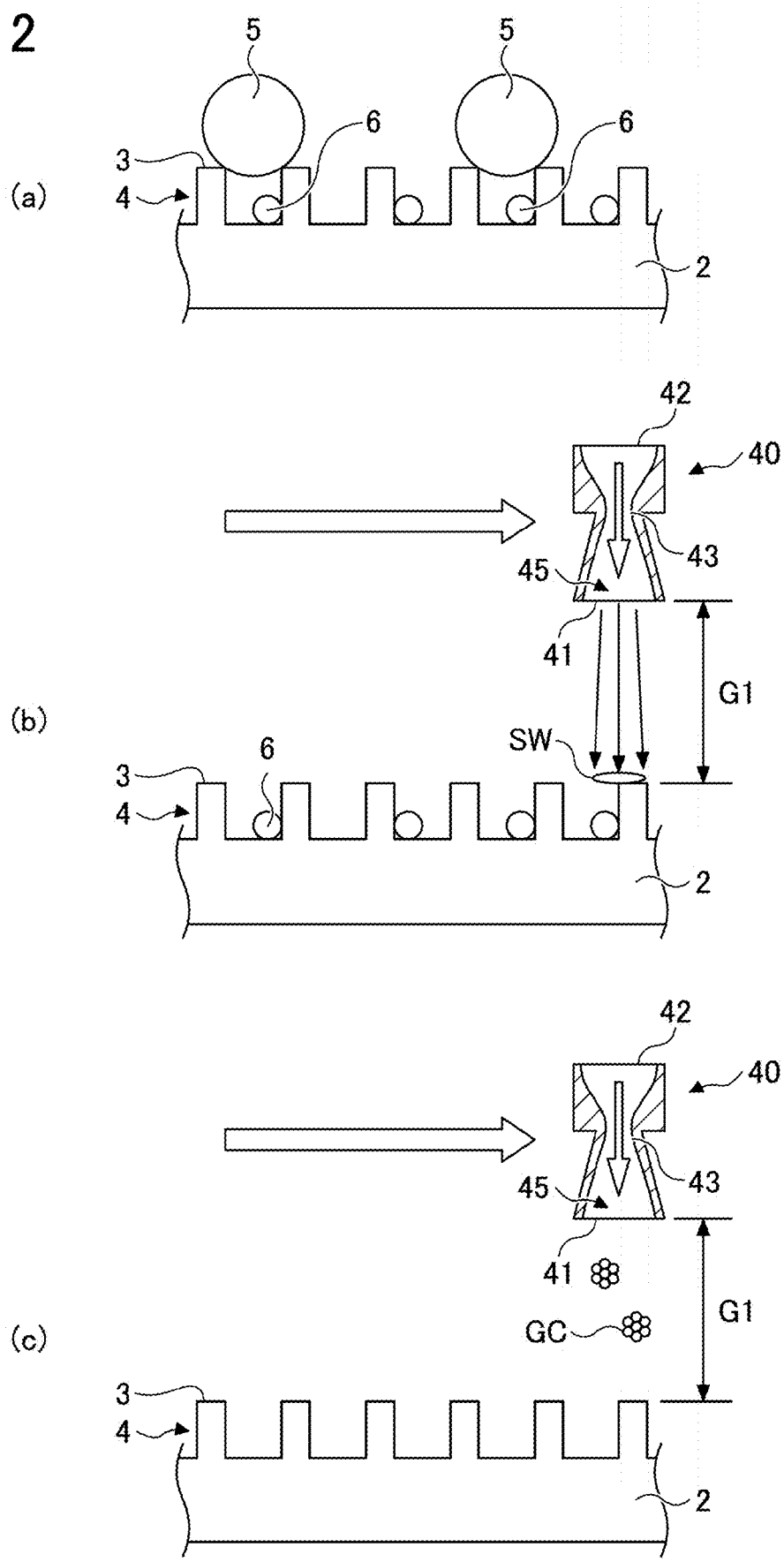
FIG. 12 is a diagram illustrating changes over time of a state of the substrate that is cleaned by the substrate cleaning method according to an embodiment.

FIG. 12 is a diagram illustrating changes over time of the state of the substrate that is cleaned by the substrate cleaning method according to an embodiment. FIG. 12(a) illustrates a state of the substrate immediately before the step S101 of spraying gas. FIG. 12(b) illustrates a state of the substrate immediately after step S105 of removing large-sized particles by vertical shock waves. FIG. 12(C) illustrates a state of the substrate immediately after step S110 of removing small-sized particles 6 by gas clusters.

Step S105 of removing the large-sized particles 5 by the vertical shock waves SW may be performed after step S110 of removing the small-sized particles 6 by the gas clusters GC, but may be performed before step S110 as illustrated in FIG. 12. By removing the large-sized particles 5 first, the small-sized particles 6 are exposed, and therefore, the efficiency of removing the small-sized particles 6 can be enhanced. It is particularly effective when the main surface 3 of the substrate 2 has a protruding-recessed pattern 4.

As long as the gas clusters GC are caused to collide with the area where collided with the vertical shock waves SW, in parallel with performing steps S102 to S105 using one gas nozzle 40, steps S107 to S110 may be performed using another one gas nozzle 40.

Meanwhile, upon the gas sprayed from the gas nozzle 40 illustrated in FIG. 1 or the like colliding with the main surface 3 of the substrate 2, a radial airflow is formed. This airflow flows along the main surface 3 of substrate 2 and is blown onto the inner wall surface 22 of the processing container 20.

The inner wall surface 22 of the processing container 20 has an upper wall surface 23, a lower wall surface 24, and a side wall surface 25 extending from the outer periphery of the upper wall surface 23 to the outer periphery of the lower wall surface 24. Because the main surface 3 of the substrate 2 is arranged horizontally, airflow flowing along the main surface 3 of the substrate 2 is blown onto the side wall surface 25.

The airflow flowing along the main surface 3 of the substrate 2 sprays particles 5 and 6 peeled off from the main surface 3 of the substrate 2 onto the side wall surface 25 of the processing container 20. Therefore, the particles adhere to the side wall surface 25 of the processing container 20.

Thus, in order to remove the particles adhering to the side wall surface 25 of the processing container 20, the controller 90 controls collision of gas sprayed from the gas nozzle 40 with a collision board arranged within the processing container 20. As the collision board, the substrate holder 30 may be used, for example, as illustrated in FIG. 13.

It should be noted that a dedicated dummy substrate may be used instead of the substrate holder 30. The dummy substrate is held by the substrate holder 30 similar to the substrate 2. The dummy substrate may be stored inside the processing container 20, or may be stored outside the processing container 20 and carried into the inside of the processing container 20 at the time of use.

Figure 13:
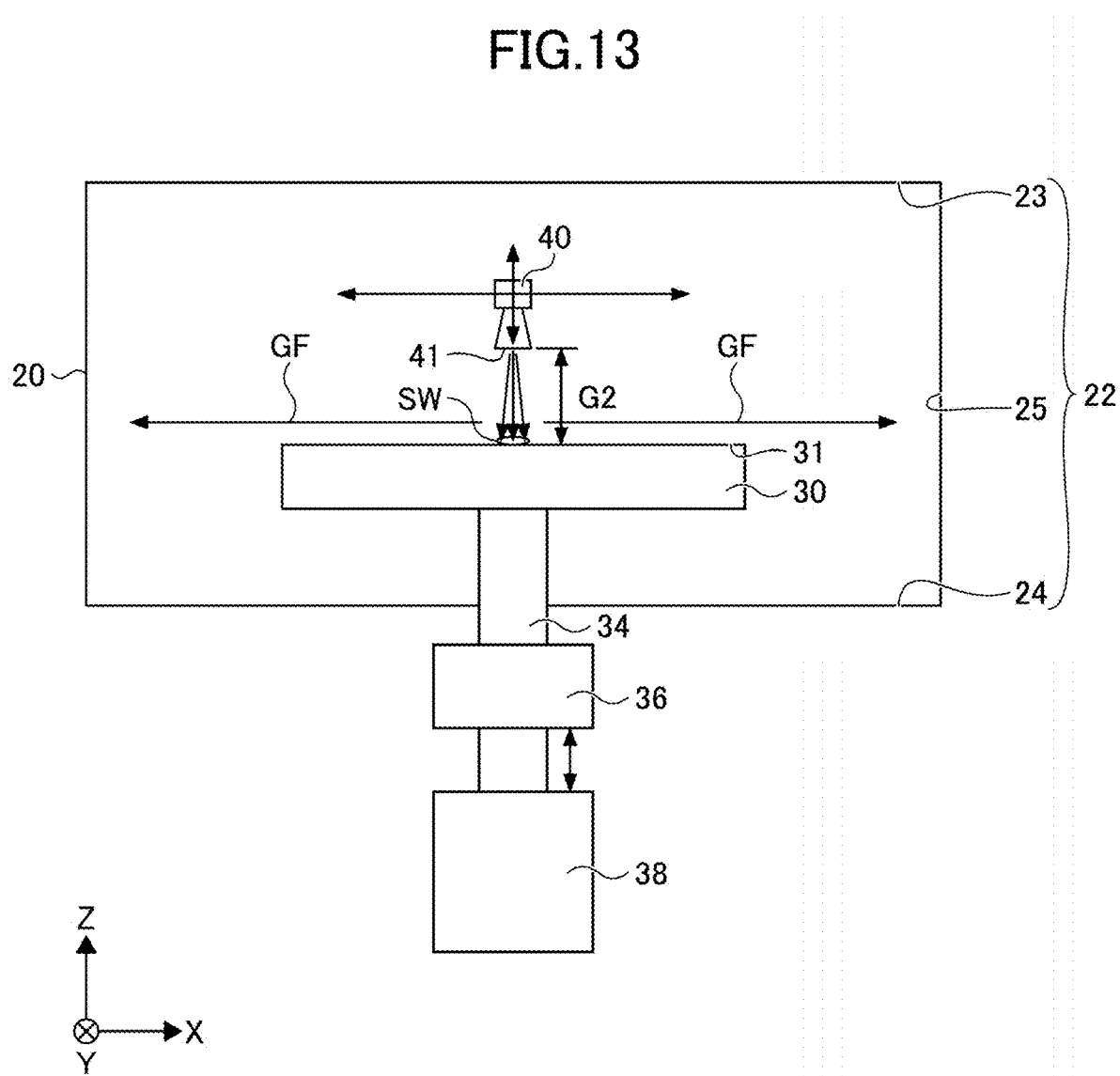
FIG. 13 is a side view illustrating a state of the substrate processing device at the time of cleaning the processing container according to an embodiment.

FIG. 13 is a side view illustrating a state of the substrate processing device at the time of cleaning the processing container according to an embodiment. Cleaning of the processing container 20 is performed, for example, after one substrate 2 has been carried out from the inside of the processing container 20 to the outside of the processing container 20, and before another substrate 2 has been carried from the outside of the processing container 20 to the inside of the processing container 20.

The controller 90 causes the gas sprayed from the gas nozzle 40 to collide with the substrate holding surface 31 of the substrate holder 30 to form a radial airflow GF. The airflow GF flows along the main surface 3 of substrate 2 and is blown onto the side wall surface 25 of the processing container 20 to remove particles adhering to the side wall surface 25.

Figure 14:
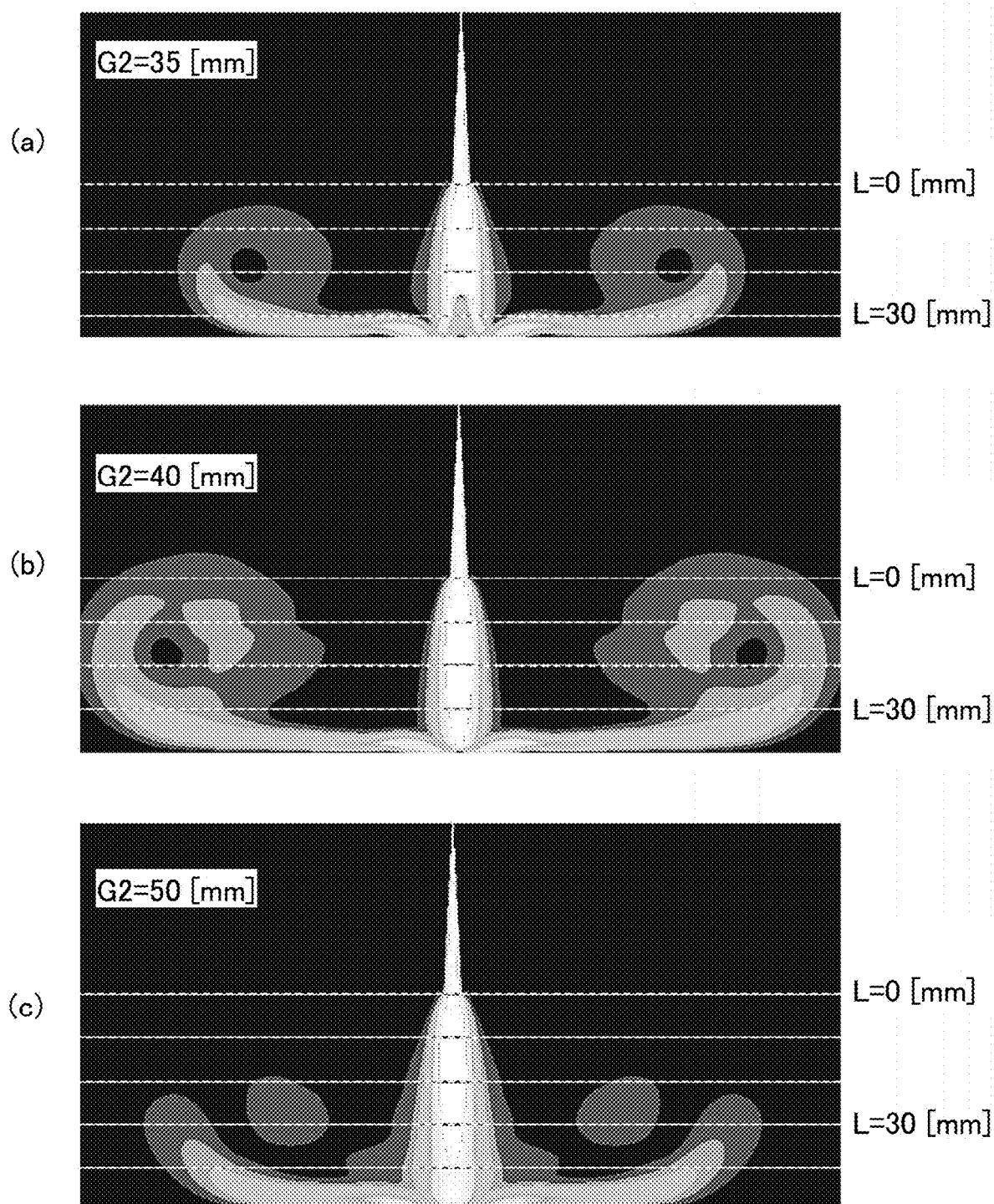
FIG. 14 is a diagram illustrating an example of a relationship between a gap G2 between the spray port of the gas nozzle and the substrate holding surface of the substrate holder and a flow velocity of the gas sprayed from the spray port.

FIG. 14 is a diagram illustrating an example of a relationship between a gap G2 between the spray port of the gas nozzle and the substrate holding surface of the substrate holder and the flow velocity of the gas sprayed from the spray port. FIG. 14(a) illustrates an example of a simulation result of the flow velocity when the gap G2 is 35 mm. FIG. 14(b) illustrates an example of a simulation result of the flow rate when the gap G2 is 40 mm. FIG. 14(c) illustrates an example of a simulation result of the flow velocity when the gap G2 is 50 mm. In FIG. 14(c), the color gradation represents the magnitude of the flow velocity. The closer the color is from black to white, the greater the flow velocity.

In the simulations of FIG. 14, at a position 35 mm, 40 mm, or 50 mm away from the spray port 41 of the gas nozzle 40 downward, as the substrate holding surface 31 of the substrate holder 30, a wall boundary with no gas inflow and outflow was set at the lower one side of a rectangular two-dimensional analysis area. An outflow boundary where gas freely flows out was set for the other three sides of the rectangular two-dimensional analysis area. Also, in the simulations of FIG. 14, the content rate C of carbon dioxide was set to 100% by volume and the content rate of hydrogen gas was set to 0% by volume. The other settings were the same as the settings of the simulations of FIG. 4.

As can be seen from FIG. 14, when the gap G2 is 40 mm, it is found that the radial airflow GF can be flowed to a long distance at a high speed by the gas colliding with the substrate holding surface 31 of the substrate holder 30. When the gap G2 is about 40 mm, as can been seen from FIG. 8 described above, the vertical shock waves SW collide with the substrate holding surface 31 of the substrate holder 30. Accordingly, it is found that by causing the vertical shock waves SW to collide with the substrate holding surface 31 of the substrate holder 30, the radial airflow GF can be flowed to a long distance at a high speed.

Figure 15:
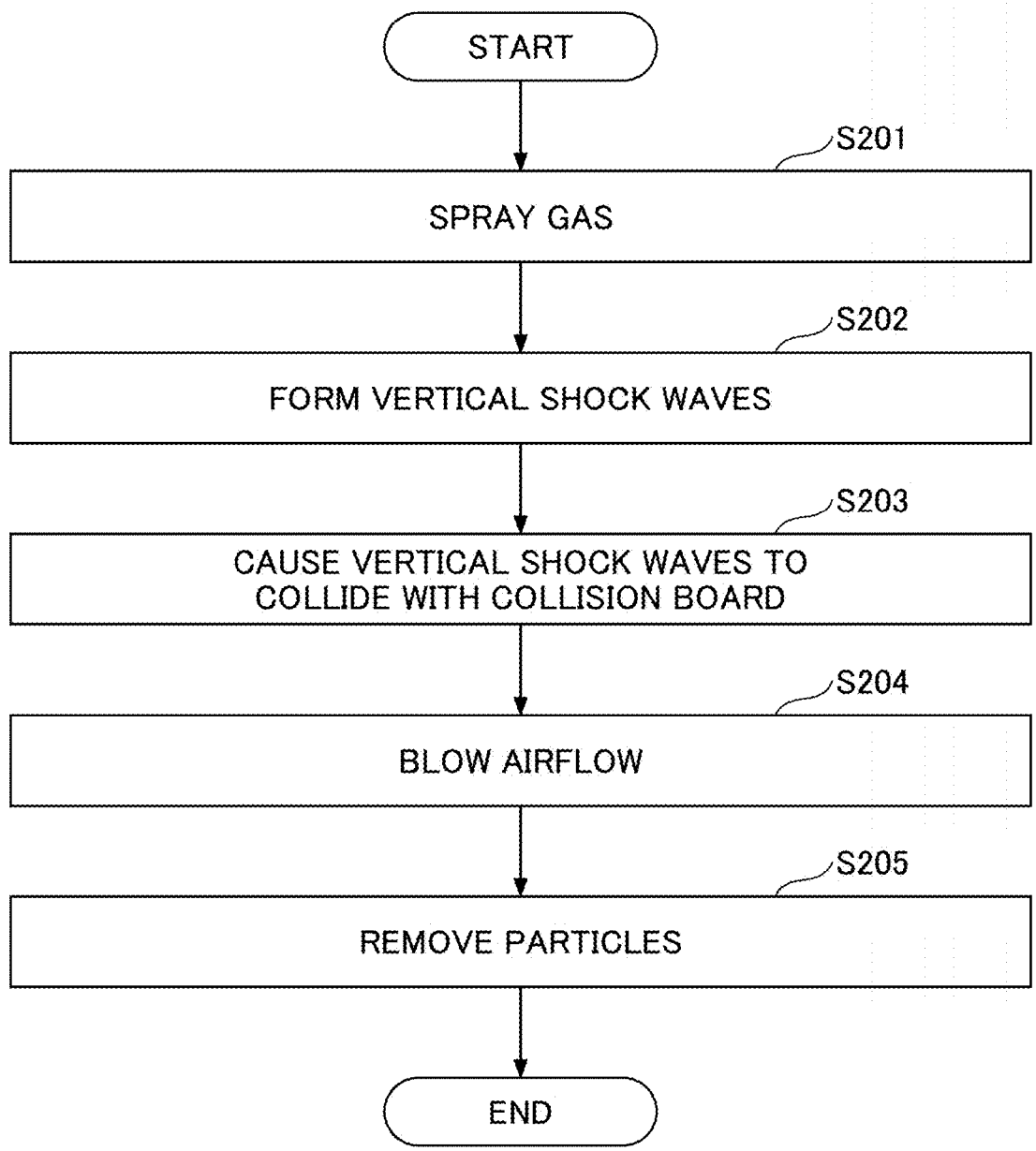
FIG. 15 is a flowchart illustrating a processing container cleaning method according to an embodiment.

FIG. 15 is a flowchart illustrating a processing container cleaning method according to an embodiment. Each step illustrated in FIG. 15 is performed under the control of the controller 90. Each of the steps illustrated in FIG. 15 is performed, for example, after one substrate 2 has been carried out from the inside of the processing container 20 to the outside of the processing container 20, and before another substrate 2 has been carried from the outside of the processing container 20 to the inside of the processing container 20.

The processing container cleaning method includes step S201 of spraying gas from the spray port 41 of the gas nozzle 40 arranged within the processing container 20. In step S201, the depressurization mechanism 70 sucks gas inside the processing container 20 and the gas supply mechanism 60 supplies gas to the gas nozzle 40.

The composition of the gas supplied to the gas nozzle 40 (e.g., the content rate C of carbon dioxide gas) is adjusted by the first flow rate adjustment valve 65 and the second flow rate adjustment valve 67, for example. When the content rate C of carbon dioxide gas is 100% by volume, the second open/close valve 66 closes the flow path of the gas. Also, the supply pressure P of the gas supplied to the gas nozzle 40 is adjusted by the pressure adjustment valve 63.

The processing container cleaning method includes step S202 of forming vertical shock waves SW by spraying the gas. The areas GA and GB where the vertical shock waves SW are formed are discontinuous (see FIG. 6), and there are areas where vertical shock waves SW are not formed.

The processing container cleaning method includes step S203 of causing the vertical shock waves SW to collide with the substrate holding surface 31 of the substrate holder 30. The wavefront of the vertical shock waves SW may collide in parallel with the substrate holding surface 31 of the substrate holder 30. The range over which the vertical shock waves SW act on the substrate holding surface 31 of the substrate holder 30 is wide.

When causing the vertical shock waves SW to collide with the substrate holding surface 31 of the substrate holder 30, the gap G2 between the spray port 41 of the gas nozzle 40 and the substrate holding surface 31 of the substrate holder 30 may be controlled to be, for example, 37 mm or more and 45 mm or less. It is possible to cause the strong vertical shock waves SW to collide with the substrate holding surface 31 of the substrate holder 30.

Also, when causing the vertical shock waves SW to collide with the substrate holding surface 31 of the substrate holder 30, the mass flux density D of the gas near the substrate holding surface 31 of the substrate holder 30 may be controlled to be, for example, 6 kg/m$^2$s or more. It is possible to cause the strong vertical shock waves SW to collide with the substrate holding surface 31 of the substrate holder 30. It should be noted that D may be controlled to be 15 kg/m²s or less.

The processing container cleaning method includes step S204 of blowing airflow GF generated by the vertical shock waves SW colliding with the substrate holding surface 31 of the substrate holder 30 onto the inner wall surface 22 of the processing container 20. The airflow GF is radially formed and is blown onto the side wall surface 25 of the processing container 20.

The processing container cleaning method includes step S205 of removing particles adhering to the inner wall surface 22 of the processing container 20 by blowing the airflow GF onto the inner wall surface 22 of the processing container 20. The particles removed from the inner wall surface 22 of the processing container 20 are discharged from the inside of the processing container 20 to the outside of the processing container 20 via the suction ports 27 formed on the lower wall surface 24 of the processing container 20.

Step S201 to step S205 described above are repeatedly performed while maintaining the gap G2 within a predetermined range (e.g., 37 mm or more to 45 mm or less) and moving both the substrate holder 30 and the gas nozzle 40 in the vertical direction. A wide range of the side wall surface 25 can be cleaned in the vertical direction.

Step S201 to step S205 described above are repeatedly performed while the gas nozzle 40 is moved in the horizontal direction. The gas nozzle 40 can be made close to a plurality of portions separate in the circumferential direction of the side wall surface 25 (e.g., a left side portion and a right side portion in FIG. 13). Therefore, the plurality of portions separate in the circumferential direction of the side wall surface 25 can be strongly cleaned.

The strength of the gas collision with the substrate holder 30 at the time of cleaning the processing container may be set to be greater than the strength of the gas collision with the substrate 2 at the time of cleaning the substrate. The strength of the airflow blown onto the side wall surface 25 of the processing container 20 is weaker at the time of cleaning the substrate than that at the time of cleaning the processing container. Accordingly, the particles that are not separated from the side wall surface 25 at the time of cleaning the processing container are also not separated at the time of cleaning the substrate, and therefore do not contaminate the substrate 2 at the time of cleaning the substrate.

The collision strength of the gas is expressed by the mass flux density D. As the content rate of carbon dioxide gas increases, the mass flux density D increases as described above, and therefore, the collision strength of the gas increases. Also, as the supply pressure P increases, the mass flux density D increases as described above, and therefore the collision strength of the gas increases.

As described above, the processing container cleaning method according to the present embodiment includes step S203 of causing the vertical shock waves SW to collide with the substrate holding surface 31 of the substrate holder 30. The airflow GF can be flowed to a long distance at a high speed, and particles adhering to the inner wall surface 22 of the processing container 20 can be efficiently removed with the strong airflow GF. The processing container 20 can be automatically cleaned, which can reduce the time and effort of the user.

It should be note that the processing container cleaning method of the present embodiment does not include a step of forming a vortex air flow that carries particles removed from the inner wall surface 22 of the processing container 20, but may further include this step. Particles can be efficiently discharged to the outside of the processing container 20 by being carried with a vortex airflow (which may be also referred to as "cyclone airflow" hereinafter).

FIG. 16 is a diagram illustrating gas nozzles that form a vortex airflow inside the processing container according to an embodiment. FIG. 16(a) is a plan view illustrating an example of an arrangement of gas nozzles. FIG. 16(b) is a cross-sectional view illustrating an example of a gas nozzle taken along the A-A line of FIG. 16(a).

The substrate processing device 10 includes, inside the processing container 20, gas nozzles 80 that form a vortex airflow to carry particles removed from the inner wall surface 22 of the processing container 20. For example, the plurality of gas nozzles 80 are arranged with intervals in the circumferential direction on the side wall surface 25 of the processing container 20.

Each of the plurality of gas nozzles 80 has an outlet 81 for spraying gas in a direction orthogonal to the radial direction of the processing container 20. The sprayed gas flows in a vortex manner along the side wall surface 25 of the processing container 20 and is discharged from the suction ports 27 formed on the lower wall surface 24 of the processing container 20.

The outlet 81 may spray gas, for example, diagonally downward. It should be noted that the outlet 81 may spray gas horizontally or may spray gas diagonally upward. In any case, by the outlet 81 spraying gas in a direction orthogonal to the radial direction of the processing container 20, a vortex airflow is formed within the processing container 20.

An inert gas, such as nitrogen gas, is used as the gas sprayed from the outlet 81.

FIG. 17 is a diagram illustrating an example of a cross-sectional shape of a nozzle hole of a gas nozzle that form a vortex airflow. FIG. 17(a) is a diagram illustrating an example of a cross-sectional shape of a nozzle hole having a constant inside diameter from an inlet to an outlet. In FIG. 17(a), the diameter of the inlet 82 is 2 mm, the diameter of the outlet 81 is 2 mm, and the distance from the inlet 82 to the outlet 81 is 5 mm. FIG. 17(b) is a diagram illustrating an example of a cross-sectional shape of a nozzle hole having an inside diameter increasing from an inlet to an outlet. In FIG. 17(b), the diameter of the inlet 82 is 0.5 mm, the diameter of the outlet 81 is 2 mm, the distance from the inlet 82 to the outlet 81 is 5 mm, and the taper angle from the inlet 82 to the outlet 81 is about 16°.

Figure 18:
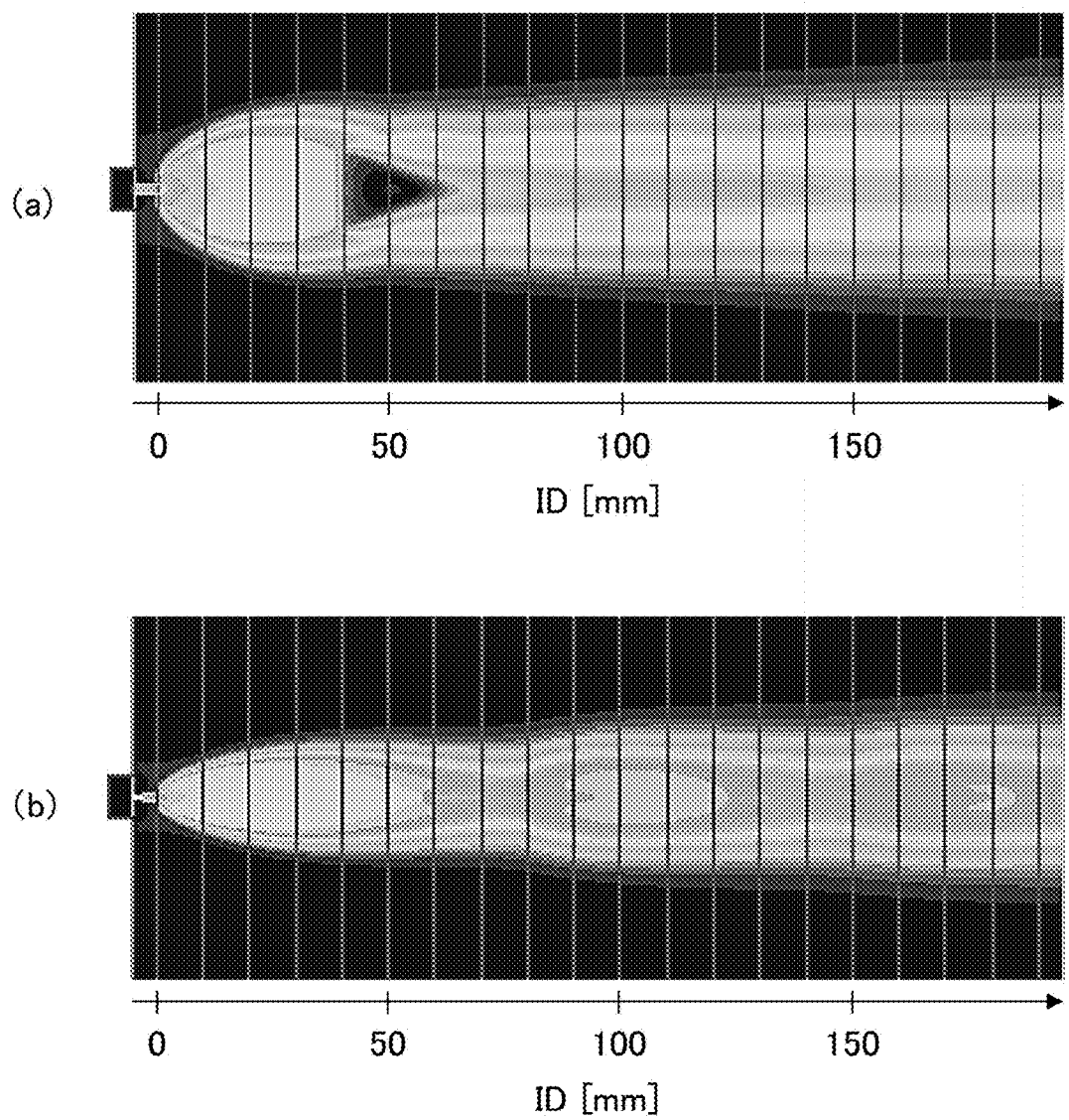
FIG. 18 is a diagram illustrating an example of simulation results of a relationship between the cross-sectional shape of the nozzle hole of the gas nozzle that forms a vortex airflow and the flow velocity of the gas sprayed from the outlet of the nozzle hole.

FIG. 18 is a diagram illustrating an example of simulation results of a relationship between the cross-sectional shape of the nozzle hole of the gas nozzle that forms a vortex airflow and the flow velocity of the gas sprayed from the outlet of the nozzle hole. FIG. 18(a) is a diagram illustrating an example of a simulation result of the flow velocity of the gas sprayed from the outlet of the nozzle hole illustrated in FIG. 17(a). FIG. 18(b) is a diagram illustrating an example of a simulation result of the flow velocity of the gas sprayed through the outlet of the nozzle hole illustrated in FIG. 17(b). In FIG. 18, the color gradation represents the magnitude of the flow velocity. The closer the color is from black to white, the greater the flow velocity. Also in FIG. 18, the horizontal axis represents the spray distance ID from the outlet 81 of the nozzle hole.

As can be seen from FIG. 18, when using the nozzle hole of which the inner diameter increases from the inlet 82 to the outlet 81, it is possible to flow gas to a longer distance at a higher speed than when using the nozzle hole having a constant inner diameter from the inlet 82 to the outlet 81.

Accordingly, it can be seen that, by using a nozzle hole of which the inner diameter increases from the inlet 82 to the outlet 81, it is possible to efficiently discharge particles removed from the inner wall surface 22 of the processing container 20.

Although the substrate cleaning method, the processing container cleaning method, and the substrate processing apparatus according to the embodiment of present disclosure have been described above, the present disclosure is not limited to the above described embodiment and the like. Various changes, modifications, replacements, additions, deletions, and combinations are possible within the scope of the claims. Of course, these also belong to the technical scope of the present disclosure.

Although the gas supplied by the gas nozzle 40 in the above described embodiment is a mixture gas of carbon dioxide gas and hydrogen gas or is pure carbon dioxide gas, the technology of the present disclosure is not limited to this. For example, helium (He) gas may be used instead of hydrogen gas.

Although the substrate 2 is a silicon wafer in the embodiment described above, it may be a silicon carbide substrate, a sapphire substrate, a glass substrate, or the like.

In the processing container cleaning method of the above described embodiment, because the substrate holder 30 or a dummy substrate is used as a collision board, the surface with which the vertical shock waves SW collide is a horizontal surface and a horizontal airflow GF is formed. However, the configuration of the collision board is not particularly limited. The collision board may have an inclined surface for the surface with which the vertical shock waves SW collide so as to direct the airflow GF diagonally upward or diagonally downward.

DESCRIPTION OF THE REFERENCE NUMERALS

- 2 substrate
- 3 main surface
- 5 large-sized particles
- 6 small-sized particles
- 10 substrate processing device
- 20 processing container
- 22 inner wall surface
- 30 substrate holder (collision board)
- 31 substrate holding surface
- 40 gas nozzle (first gas nozzle)
- 41 spray port
- 80 gas nozzle (second gas nozzle)
- 90 controller
- SW vertical shock waves
- GC gas clusters

The invention claimed is:

1. A processing container cleaning method comprising:
    spraying gas from a spray port of a gas nozzle arranged within a processing container;
    causing vertical shock waves, generated by spraying the gas from the gas nozzle, to collide with a surface of a collision board arranged within the processing container;
    blowing an airflow, generated by the vertical shock waves colliding with the surface of the collision board, onto an inner wall surface of the processing container; and
    removing particles adhering to the inner wall surface of the processing container, by blowing the airflow onto the inner wall surface of the processing container,
    wherein the method further comprises:
    controlling the gas nozzle to move in a radial direction of a substrate holder that is configured to hold a substrate arranged within the processing container between a position directly above a center of the substrate holder and a position directly above an outer periphery of the substrate holder.

2. The processing container cleaning method according to claim 1, wherein the method further comprises controlling, when causing the vertical shock waves to collide with the surface of the collision board, a mass flux density of the vertical shock waves near the surface of the collision board to be greater than or equal to 6 kg/m$^2$s.

3. The processing container cleaning method according to claim 1, wherein when causing the vertical shock waves to collide with the surface of the collision board, a gap between the spray port of the gas nozzle and the surface of the collision board is 37 mm or more and 45 mm or less.

4. The processing container cleaning method according to claim 1, further comprising:
    forming, within the processing container, a vortex airflow that carries the particles removed from the inner wall surface of the processing container.

* * * * *